(12) United States Patent
Goida et al.

(10) Patent No.: US 9,209,121 B2
(45) Date of Patent: Dec. 8, 2015

(54) DOUBLE-SIDED PACKAGE

(71) Applicant: Analog Devices, Inc., Norwood, MA (US)

(72) Inventors: Thomas M. Goida, Windham, NH (US); Xiaojie Xue, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 19 days.

(21) Appl. No.: 13/757,299

(22) Filed: Feb. 1, 2013

(65) Prior Publication Data

US 2014/0217566 A1 Aug. 7, 2014

(51) Int. Cl.
*H01L 23/495* (2006.01)
*H01L 23/04* (2006.01)
*H01L 23/00* (2006.01)
*G01P 1/02* (2006.01)

(52) U.S. Cl.
CPC .......... *H01L 23/49575* (2013.01); *H01L 23/04* (2013.01); *H01L 24/03* (2013.01); *G01P 1/023* (2013.01); *H01L 2924/1461* (2013.01)

(58) Field of Classification Search
USPC ................. 257/666, 676, 686, 777, 723, 724; 438/107, 109, 110, 111, 123
See application file for complete search history.

(56) References Cited

U.S. PATENT DOCUMENTS

| | | | |
|---|---|---|---|
| 4,303,934 A | 12/1981 | Stitt | |
| 6,326,611 B1 | 12/2001 | Kennedy et al. | |
| 6,388,336 B1 * | 5/2002 | Venkateshwaran et al. | .. 257/779 |
| 6,777,789 B1 * | 8/2004 | Glenn et al. | ................... 257/676 |
| 7,408,244 B2 * | 8/2008 | Lee et al. | ........................ 257/666 |
| 7,411,281 B2 | 8/2008 | Zhang | |
| 7,489,025 B2 | 2/2009 | Chen et al. | |
| 7,619,303 B2 | 11/2009 | Bayan | |
| 8,080,925 B2 | 12/2011 | Berger et al. | |
| 8,653,635 B2 * | 2/2014 | Gowda et al. | .................. 257/666 |
| 2005/0046003 A1 * | 3/2005 | Tsai | ............................... 257/686 |
| 2005/0285239 A1 * | 12/2005 | Tsai et al. | ...................... 257/676 |
| 2006/0261453 A1 * | 11/2006 | Lee et al. | ........................ 257/676 |

OTHER PUBLICATIONS

Kim et al., "Multi-Flip Chip on Lead Frame Overmolded IC Package: A Novel Packaging Design to Achieve High Performance and Cost Effective Module Package," Electronic Components and Technology Conference, 2005, pp. 1819-1821.

* cited by examiner

*Primary Examiner* — Sheila V Clark
(74) *Attorney, Agent, or Firm* — Knobbe Martens Olson & Bear, LLP

(57) ABSTRACT

Various embodiments of an integrated device package are disclosed herein. The package may include a leadframe having a first side and a second side opposite the first side. The leadframe can include a plurality of leads surrounding a die mounting region. A first package lid may be mounted on the first side of the leadframe to form a first cavity, and a first integrated device die may be mounted on the first side of the leadframe within the first cavity. A second integrated device die can be mounted on the second side of the leadframe. At least one lead of the plurality of leads can provide electrical communication between the first integrated device die and the second integrated device die.

30 Claims, 20 Drawing Sheets

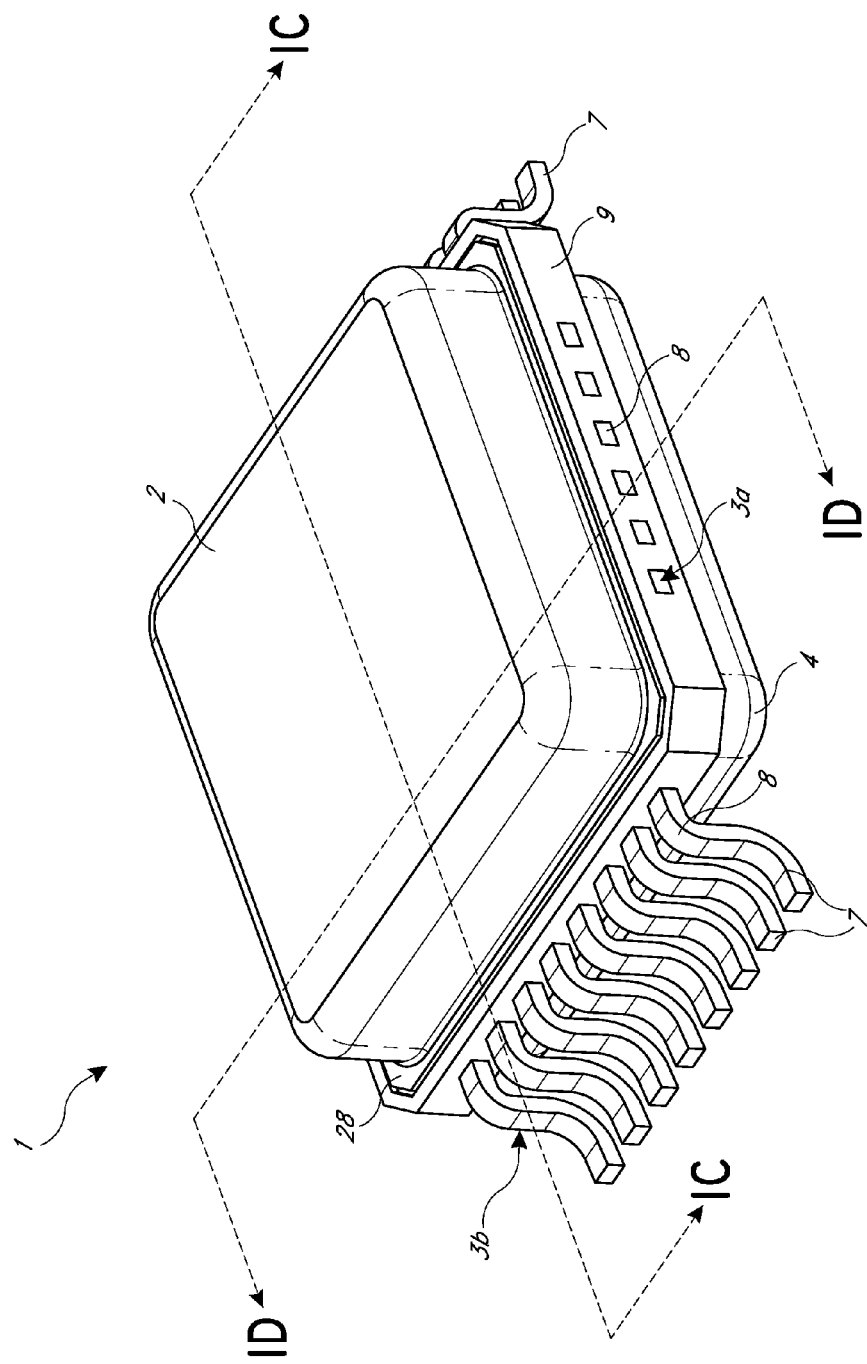
FIG. IA

DOUBLE-SIDED PACKAGE

BACKGROUND

1. Field

The field relates to apparatus and methods for packaging integrated devices, and in particular, to apparatus and methods for forming packages that include one or more cavities configured to house the device die(s).

2. Description of the Related Art

Integrated device packages can be manufactured to include numerous device dies that perform different functions. For example, some packages can include both sensor and processor dies. Although including multiple device dies in a package can increase the package's functionality and performance, the use of multiple device dies can also increase the height and/or lateral footprint of the package, which can be disadvantageous for larger electronic systems that integrate numerous packages within a small space. Furthermore, when multiple device dies are included in a package, it can be challenging to electrically interconnect the dies to one another and/or to leads that communicate with the larger electronic system. Known packaging techniques can lead to undue expansion in footprint and profile and/or lead to mechanical stresses.

Accordingly, there remains a continuing need for improved apparatus and methods for packaging integrated device dies.

SUMMARY

In one embodiment, an integrated device package is disclosed. The integrated device package can comprise a leadframe having a first side and a second side opposite the first side. The leadframe can include a plurality of leads surrounding a die mounting region. A first package lid can be mounted on the first side of the leadframe to form a first cavity. A first integrated device die can be mounted on the first side of the leadframe within the first cavity. A second integrated device die can be mounted on the second side of the leadframe. At least one lead of the plurality of leads can provide electrical communication between the first integrated device die and the second integrated device die.

In another embodiment, a method of packaging an integrated device is disclosed. The method comprises providing a leadframe having a first side and a second side opposite the first side. The leadframe can include a die attach pad, a first set of leads adjacent the die attach pad and having an inner lead portion, and a second set of leads adjacent the die attach pad and having an inner lead portion and an outer lead portion. The outer lead portion can be configured to electrically couple to a mounting board. The method can include mounting a first integrated device die on the first side of the die attach pad. The first integrated device die can be wire bonded to the first side of the inner lead portions of at least some leads in the first set of leads. The first integrated device die can be wire bonded to the first side of the inner lead portions of at least some leads in the second set of leads. Further, the method can comprise mounting a second integrated device die on the second side of the die attach pad. The second integrated device die can be wire bonded to the second side of the inner lead portions of at least some leads in the first set of leads to provide electrical communication between the first integrated device die and the second integrated device die.

In another embodiment, an integrated device package is disclosed. The integrated device package can comprise a package substrate having a first side and a second side opposite the first side. A first motion sensor die can be mounted on the first side of the package substrate. A second motion sensor die can be mounted on the second side of the package substrate.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIGS. 1A-1B are three-dimensional perspective views of a double-sided integrated device package, according to one embodiment.

DETAILED DESCRIPTION

Figure 1B:
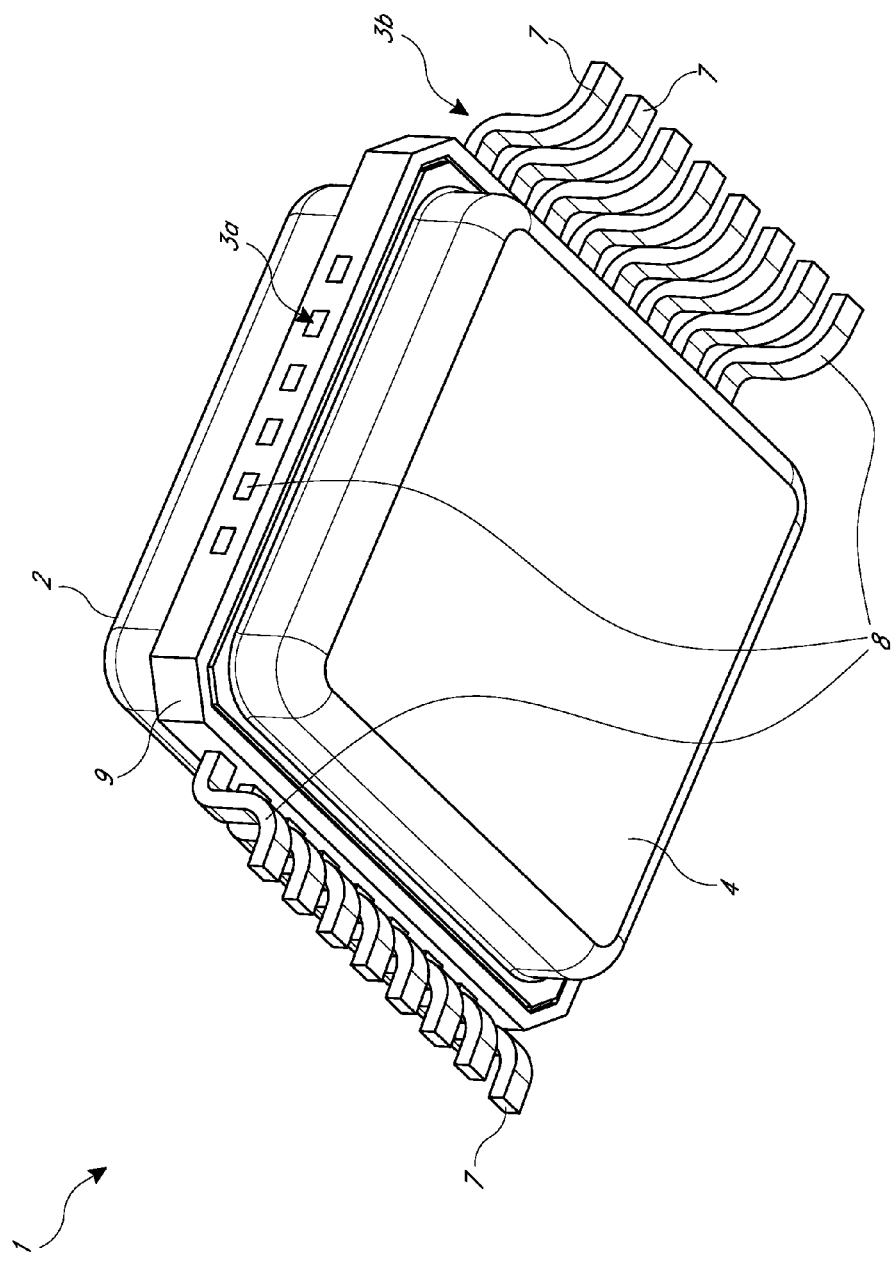

Various embodiments disclosed herein relate to an integrated device package ("package" hereinafter) having integrated device dies on opposing sides of a package substrate. For example, a first integrated device die can be mounted on a first side of a leadframe, such as a pre-molded leadframe, and a second integrated device die can be mounted on a second, opposite side of the leadframe. The first and second device dies can electrically communicate with one another through at least one lead of the leadframe. In some embodiments, the package can include two sets of leads: a first set of leads that each have an inner lead portion that does not protrude from the package body, and a second set of leads that each have both an inner lead portion and an outer lead portion that protrudes from the package body. The inner lead portions of at least some leads in the first set may be configured to provide electrical communication (e.g., by way of wire bonds) between device dies on opposing sides of the leadframe. By contrast, the die(s) may be wire bonded to the inner lead portions of at least some leads in the second set to provide electrical communication between the die(s) and the larger electronic device (e.g., a system motherboard). For example, the outer lead portions of the leads in the second set, which are typically integrally formed with the corresponding inner lead portions, can be soldered to the system motherboard of the larger electronic device to mechanically and electrically connect the die(s) and the motherboard.

In various embodiments, multiple device dies can be mounted in the package. In conventional arrangements, the device dies may be mounted adjacent one another on the package substrate, but these arrangements may disadvantageously increase the lateral footprint of the package. Skilled artisans will appreciate that it can be advantageous to manufacture the package to have a small lateral footprint to fit within constraints of sealed devices into which the package is to be incorporated. To manufacture such a compact package, in some embodiments, multiple device dies can be stacked on top of one another to reduce the package footprint. For example, a third integrated device die can be stacked on top of the first integrated device die such that the first integrated device die is disposed between the third integrated device die and the leadframe. The third integrated device die may be wire bonded to the first integrated device die to provide electrical communication between the first and third device dies. Because the first integrated device die may be wire bonded to the inner lead portions of the leads in the second set of leads, the third integrated device die can thereby electrically communicate with the larger electronic system by way of the first integrated device die.

Thus, multiple dies can be interconnected and packaged within a leadframe package, rather than a package with a laminate substrate, which can offer advantages with respect to stress isolation, warpage, and reliability.

The disclosed packages may include one or more inertial motion sensor device dies in some embodiments. For example, it can be advantageous in certain applications (such as automotive applications) to include both an accelerometer and a gyroscope in a single package. A processor die can be included to process the signals generated by the accelerometer and/or gyroscope. For example, in some embodiments, the gyroscope die and the accelerometer die may be mounted on opposite sides of the package substrate. One of the gyroscope die and the accelerometer die may be stacked on top of the processor die such that the processor die is disposed between the motion sensor die (e.g., the gyroscope or the accelerometer) and the package substrate. The motion sensor die that is stacked on the processor die may be wire bonded to the processor die to electrically communicate with the processor die. In embodiments that utilize a leadframe as the package substrate, the processor die may be wire bonded to inner lead portions of leads in the first set of leads to electrically communicate with the other motion sensor die mounted on the opposite side of the leadframe. The processor die may also be wire bonded to inner lead portions of leads of the second set of leads to provide electrical communication to the larger electronic system by way of the corresponding outer lead portions. The disclosed motion sensor packages can be implemented as a stability control sensor package in various automotive applications to provide a multi-functional sensor device. The motion sensor die(s), e.g., the gyroscope and/or the accelerometer, may be microelectromechanical systems (MEMS) die(s) in some arrangements. Furthermore, although the illustrated embodiments show only two motion sensor dies and one processor, it should be appreciated that any suitable number of sensor die(s) (including sensors that are not motion sensors) and/or processor dies may be used. For example, more than two dies can be stacked on top of one another in some arrangements.

The disclosed packages can also include at least one package lid on one side of the package substrate that defines a first cavity. The first cavity can be formed so as to provide a vacuum environment in some embodiments. In motion sensor packages, for example, a gyroscopic die may be disposed within the first cavity. It can be advantageous to position gyroscopic dies in a vacuum cavity to reduce or eliminate stresses on the gyroscopic die that may be caused by an encapsulant or by pressure variations in air. In some embodiments, a second package lid can be mounted on an opposite side of the package substrate to define a second cavity. An accelerometer die may be positioned in the second cavity in some embodiments. In other embodiments, however, an encapsulant can be applied over the accelerometer die on the second, opposite side of the package substrate. For example, in some aspects, the accelerometer die may be less sensitive to stresses than the gyroscopic die, such that the accelerometer die may be disposed within a cavity (e.g., formed by a package lid) or may be encapsulated by an encapsulant or molding material. The lid(s) can be shaped to define the cavity, or can be planar to define the cavity in conjunction with walls integral with the substrate.

As is known in the art, stacking device dies on top of one another and/or mounting dies adjacent one another can reduce the overall footprint and/or vertical profile of the package. The dies can electrically communicate with one another and with leads to a larger electrical system.

The embodiments disclosed herein can provide various advantages compared with conventional packages. For example, space savings may be achieved from packaging multiple dies within one package, including dies on opposite sides of the packaging substrate. In a leadframe embodiment, one or more dies can be wire bonded to inner lead portions of the first set of leads to electrically communicate with die(s) mounted on the opposite side of the package substrate. Embodiments can offer further advantages with respect to stress isolation. For example, when the package is soldered to the system motherboard, stresses can be induced in the package and/or may propagate to the die(s). For example, in leadless packages (e.g., packages with exposed leads on a bottom surface of the package, such as quad flat no lead or QFN packages), stresses are readily transferred to dies within the package. Various embodiments disclosed herein utilize a leadframe that includes at least one set of leads that have outer lead portions protruding from the package body and configured to be soldered (or otherwise bonded) to corresponding bond pads on a system board of the larger electronic system. For example, in some embodiments, the outer lead portions may be bent downwardly to electrically couple to the bond pads of the system board. By soldering the bent outer lead portions to the system board, the device die(s) may be substantially isolated from stresses, e.g., differential thermal expansion during soldering, or other stresses in the final product.

In addition, in various packages, it can be important to increase the reliability of solder joints formed between the package leads and the external electronic system (e.g., a system motherboard). For example, in some applications (e.g., automotive applications), thermal cycling and/or mechanical vibrations/forces can repeatedly subject the solder joints to external loads that, over time, can reduce the reliability of the solder joints and cause the solder joints to fail. The bent outer lead portions of the package leads may be sized and shaped to increase the reliability of the solder joints formed between the package leads and the system motherboard. The protruding outer lead portions can make it easier to optically inspect the solder joints formed between the package leads and the system board. By soldering visible, outer lead portions to the system board, simpler optical inspection systems may instead be used with the various packages disclosed herein, which may reduce the cost and/or complexity of the package inspection process and increase reliability.

Moreover, in various applications, it can also be important to provide radio frequency (RF) shielding that shields the die(s) from external radiation (and/or that shields other dies in the system from radiation emitted by the disclosed package). A package lid may be mounted on one or both sides of the package substrate to form an internal cavity in which the device die(s) may be mounted. To provide RF shielding capability, the package lid may be conductive or may include one or more conductive layers. The package lid may be grounded to form the RF shield. For example, in some embodiments, a through mold via is formed through the molding material of the pre-molded leadframe, and a conductive epoxy provides electrical communication between the metal lid and a ground lead.

FIGS. 1A-1B are three-dimensional perspective views of an integrated device package 1, according to one embodiment. The package 1 can include a package substrate, which is a leadframe 8 in the illustrated embodiment. As explained herein, the portion of the leadframe 8 used in the package 1 can be formed from an array of leadframe device cells. The leadframe 8 can be formed from a thin sheet of metal, such as copper. The leadframe 8 shown in FIGS. 1A-1B is a pre-molded leadframe, in which the metallic leadframe skeleton is embedded or molded in a molding material 9. The molding material 9 can provide the structural support to the leadframe 8 and provide surfaces that contribute to sealing devices within, in conjunction with lid(s) and/or encapsulant. For example, in some embodiments, the molding material 9 can be formed from an insulating material, such as a liquid crystal polymer (LCP), polyether ether ketone (PEEK) or polyphenylene sulfide (PPS). Skilled artisans will understand that other types of molding materials may be suitable.

As shown in FIGS. 1A-1B, the leadframe 8 of the package 1 can include multiple package leads. For example, the leadframe 8 can include a first set 3a and a second set 3b of leads, which may be referred to hereinafter as "first leads 3a" and "second leads 3b," respectively. The first leads 3a may include an inner lead portion (see, e.g., FIG. 1D). The first leads 3a may be cut or otherwise truncated such that they do not extend outside the body of the package 1, and are shown flush with the body partially defined by the molding material 9. The second leads 3b may include both an inner lead portion (see, e.g., FIG. 1C) and an outer lead portion 7. The outer lead portion 7 of the leads in the second set 3b may extend outwardly to protrude from the body of the package 1 and may be bent downwardly to electrically couple to a system board of the larger electronic system. For example, a system board (e.g., motherboard) may be soldered to the outer lead portions 7 of the second leads 3b. The outer portions 7 may advantageously improve solder joint reliability and may isolate the die(s) from stresses.

A top package lid 2 and a bottom package lid 4 can be mounted to opposite sides of the leadframe 8 in the package 1 shown in FIGS. 1A-1B. The lids 2, 4 shown in FIGS. 1A-1B are shaped to form a concavity. A lip 28 of the package lids 2, 4 may be adhered to the molding material 9 on opposite sides of the leadframe 8. However, in other embodiments, the lids 2, 4 may be substantially planar and configured to be mounted to package walls extending from the package substrate. In some embodiments, the package lids 2 and/or 4 may act as electromagnetic (e.g., RF) shields that prevent electromagnetic interference. For example, the lids 2 and/or 4 may substantially shield incoming electromagnetic radiation from interfering with the die(s) of the package 1. In some embodiments, the lids 2, 4 may be formed from a metal, such as aluminum. Alternatively, the lids 2, 4 may include a multi-layer structure that includes one or more conductive layers, such as nickel-plated aluminum or metal-coated plastic.

Figure 1C:
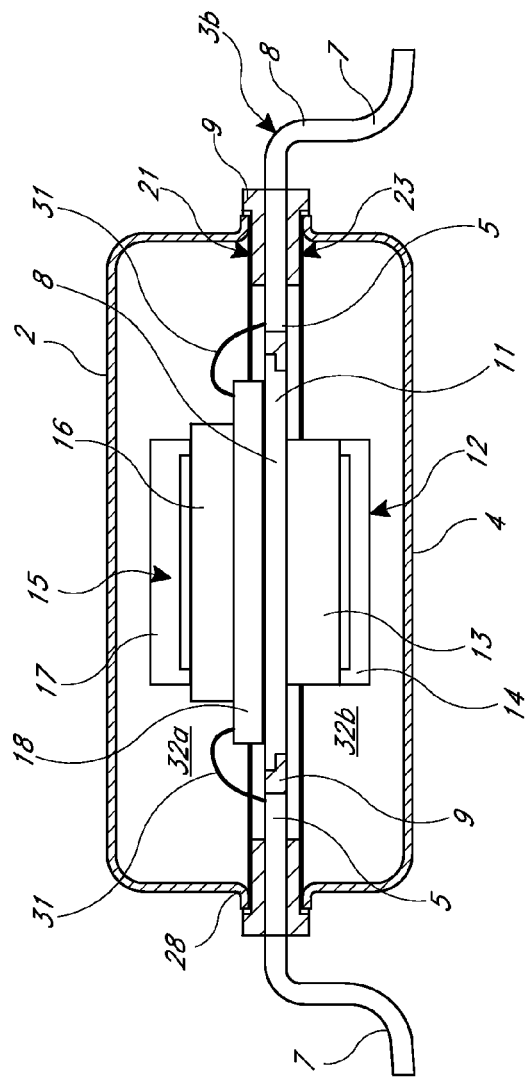
FIG. 1C is a side cross-sectional view of the integrated device package, taken along the lines 1C-1C of FIG. 1A.

FIG. 1C is a side cross-sectional view of the integrated device package 1, taken along the lines 1C-1C of FIG. 1A. As shown in FIG. 1C, the leadframe 8 can include a central die attach pad 11 that is electrically separated from the leads 3a, 3b (see, e.g., FIG. 1D for an illustration of the first leads 3a). For example, as shown in FIG. 1C, the molding material 9 may electrically separate the leads 3b from the die attach pad 11. The leadframe 8 (e.g., the die attach pad 11 and leads 3a, 3b) and molding material 9 together define a molded leadframe, which serves as a package substrate. The package substrate includes a top side 21 and a bottom side 23 opposite the top side 21. It should be appreciated that, as used herein, the top and bottom sides 21, 23 may refer to which side of the package substrate a particular component is coupled, regardless of whether the component is directly or indirectly coupled to the top or bottom surfaces of the package substrate. For example, the top and bottom sides 21, 23 of the package substrate may refer to the top and bottom surfaces of the leadframe and/or the molding material, in addition to any other materials (e.g., adhesives) that intervene on the respective sides of the package substrate. The leads 3a, 3b can substantially surround and/or be adjacent to the die attach pad 11 (or die mounting region).

One or more device dies can be mounted on the substrate. In some embodiments, the device dies can be inertial motion sensor dies and/or processor dies. The inertial motion sensor die(s) may be microelectromechanical systems (MEMS) die (s), although other types of dies may be suitable. For example, a processor die 18 can be mounted to the top side 21 of the substrate, and an inertial motion sensor die, e.g., an accelerometer die 12, can be mounted to the opposite, bottom side 23 of the substrate. The processor die 18 may be an Application-Specific Integrated Circuit (ASIC) in some arrangements, and can be programmed to process raw signals received from the accelerometer die 12 and/or from a gyroscope die (e.g., the gyroscope die 15 discussed below). The accelerometer die 12 can include an accelerometer device 13 and an accelerometer cap 14 that covers at least a portion of the accelerometer device 13. As explained above, in some arrangements, the accelerometer die 12 can be a MEMS die. The accelerometer cap 14 may be formed of silicon and may protect the accelerometer device 13 from contaminants and/or from stresses or forces induced by other components of the package 1. In some arrangements, the cap 14 for a MEMS device can also substantially seal the device, e.g., the accelerometer device 13, to provide a vacuum or low pressure environment and/or provide a different gas environment, depending upon the application. In some embodiments, the processor die 18 and the accelerometer die 12 may be mounted to the die attach pad 11 using an adhesive, such as an epoxy or solder.

Additional device dies may be mounted on the substrate. In some embodiments, for example, additional device dies can be stacked on top of the processor die 18. In various arrangements, another inertial motion sensor die may be stacked on top of the processor die 18. The inertial motion sensor die may be a MEMS die in some arrangements. For example, a gyroscope die 15 may also be mounted on the top side 21 of the die attach pad 11. In particular, as shown in FIG. 1C, the gyroscope die 15 may be stacked on top of the processor die 18. An adhesive, such as an epoxy, may be used to couple the gyroscope die 15 to the processor die 18. As with the accelerometer die 12, the gyroscope die 15 may include a gyroscope device 16 and a gyroscope cap 17 that covers at least a portion of the gyroscope device 16. Like the accelerometer cap 14, the gyroscope cap 17 may be formed of silicon and may protect the gyroscope device 16 from contaminants and/or from stresses or forces induced by other components of the package 1.

It should be appreciated that, for embodiments with inertial motion sensors on both sides of the substrate, while the accelerometer die 12 is shown mounted to the bottom side 23 and the processor die 18 and gyroscope die 15 are shown mounted to the top side 21, any suitable mounting configuration is possible. For example, the gyroscope die 15 may be mounted on the bottom side 23 and the accelerometer die 12 may be mounted on the top side 21. Further, the processor die 18 may be mounted to the bottom side 23 in some embodiments. The accelerometer die 12 may be stacked on top of or below the processor die 18 in various arrangements. In addition, although inertial motion sensor dies (e.g., the accelerometer die 12 and the gyroscope die 15) are illustrated herein, it should be appreciated that any suitable integrated device die may be used in the disclosed embodiments. For example, other types of sensor dies may be incorporated in the package 1 in addition to, or instead of, the illustrated motion sensor die. Furthermore, in some embodiments, various types of processor dies may be used in addition to, or instead of, the illustrated motion sensor dies.

The top lid 2 can be mounted to the molding material 9 on the top side 21 of the package substrate, and the bottom lid 4 can be mounted to the molding material 9 on the bottom side 23 of the package substrate. In some arrangements, an adhesive can be used to couple the lip 28 of each lid 2, 4 to the molding material 9. The lids 2, 4 illustrated in FIG. 1C are shaped to form a concavity. For example, upon mounting the top lid 2 to the molding material 9, a top cavity 32a may be formed. The processor die 18 and the gyroscope die 15 may be positioned within the top cavity 32a. The bottom lid 4 can also form a bottom cavity 32b on the bottom side 23 of the leadframe 8, such that the accelerometer die 12 is positioned within the bottom cavity 32b. Accelerometers may be less sensitive to mechanical stresses than gyroscopes. The top lid 2 and/or the bottom lid 4 can provide mechanical protection to the dies and the wire bonds. Further, the cavities 32a, 32b can provide separation between the dies 12, 15, 18 and the associated lids 2, 4, which can reduce or prevent the transfer of stresses from the package (e.g., the lids 2, 4, or a molding material or encapsulant) to the dies.

The second leads 3b of the leadframe 8 are illustrated in the cross-section of FIG. 1C. As explained above with respect to FIGS. 1A-1B, the second leads 3b can include inner portions 5 embedded within the package 1 and integral outer portions 7 extending from the body of the package 1. The body in the illustrated embodiment is defined by the lids 2, 4 and the molding material 9. As shown in FIG. 1C, the processor die 18 can electrically couple to the inner portions 5 of the second leads 3b by way of processor bonding wires 31. In particular, the processor bonding wires 31 can electrically couple to the top side 21 of the inner portions 5 of the second leads 3b. The processor bonding wires 31 can be made of gold or any other suitable conductor. The processor bonding wires 31 may provide electrical communication between contacts on the processor die 18 and the inner portions 5 of the second leads 3b. In turn, the outer portions 7 of the second leads 3b can provide electrical communication between the inner portions 5 and a system board of the larger electronic system (not shown). In some embodiments, one or more of the second leads 3b may not be wire bonded or electrically coupled to a device die.

Thus, the second leads 3b can generally be shaped to provide electrical communication between the package 1 (e.g., the processor die 18) and the larger, external electronic system, by way of the inner portions 5 and the outer portions 7. Furthermore, by bending the outer portions 7 of the second leads 3b away from the package body, the device dies can be better isolated from thermal and mechanical stresses, such as during soldering or environmental stresses in the final product (e.g., automobile). Furthermore, the shape and increased area of the outer portions 7 can provide for a strong and reliable solder joint between the package 1 and the system board, compared to QFN packages. In addition, because the outer portions 7 extend outside the package 1, standard optical inspection systems (as opposed to, e.g., x-ray systems) may be used to inspect the robustness of the solder joint.

Figure 1D:
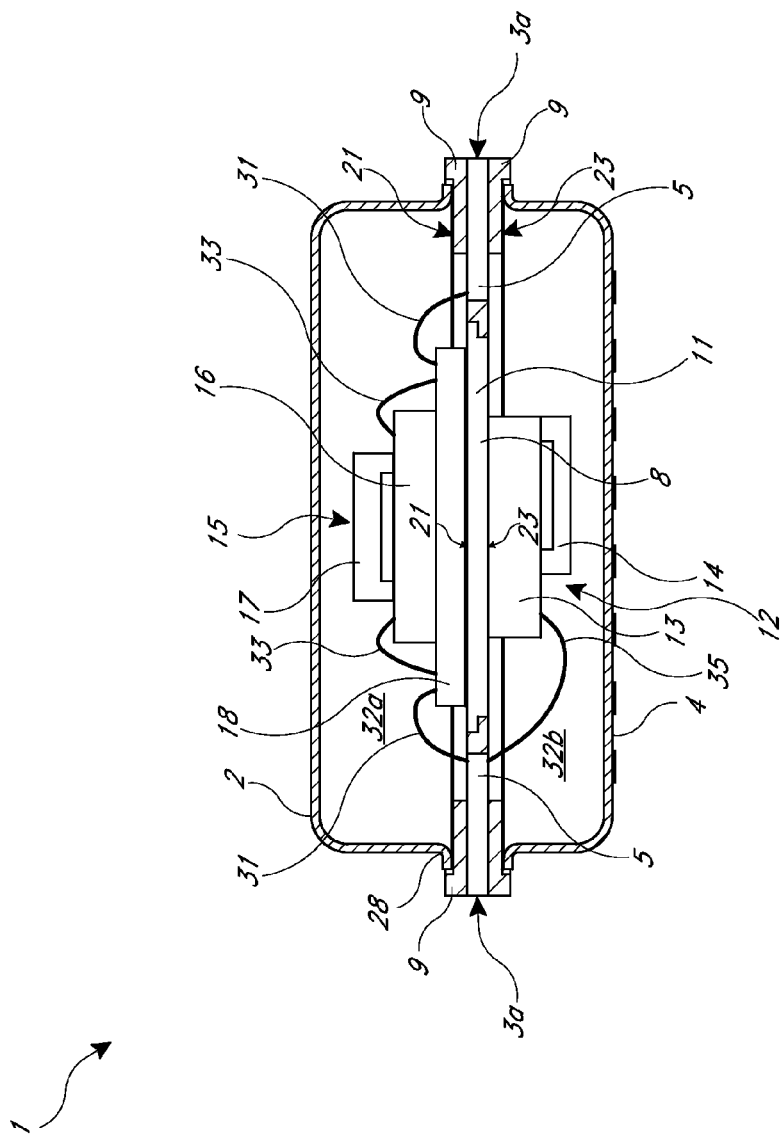
FIG. 1D is a side cross-sectional view of the integrated device package, taken along the lines 1D-1D of FIG. 1A.

FIG. 1D is a side cross-sectional view of the integrated device package 1, taken along the lines 1D-1D of FIG. 1A. FIG. 1D illustrates many of the same components as FIG. 1C. However, the cross-section of FIG. 1D illustrates the first leads 3a shown in FIGS. 1A-1B. As explained above, the first leads 3a may only include the inner portions 5 embedded within the body of the package, which are configured to electrically couple to device dies in the package 1 by way of, e.g., bonding wires. The first leads 3a may initially include outer portions like those illustrated in FIG. 1C, which are subsequently cut or otherwise truncated to form only the inner portions 5, such as during package singulation from a leadframe array. As shown in FIG. 1D, the ends of the inner portions 5 of the first leads 3a may be substantially flush with the exterior of the molding material 9 of the package 1, and thus flush with the package body.

In contrast to the inner portions 5 of the second leads 3b, the inner portions 5 of the first leads 3a may provide electrical communication between device dies on opposite sides of the package substrate. For example, the accelerometer die 12 can electrically couple to the inner portions 5 of the first leads 3a by way of accelerometer bonding wires 35. As the accelerometer die 12 is mounted to the bottom side 23 of the package substrate, the accelerometer die 12 can be wire bonded to the bottom side 23 of the inner portions 5 of the first leads 3a. The processor die 18 may similarly electrically couple to the top side 21 of the inner portions 5 of the first leads 3a by way of the processor bonding wires 31. Because the processor die 18 and the accelerometer die 12 are electrically coupled to a common lead (or, alternatively, to two separate leads that are shorted together), the processor die 18 can receive and process raw signals detected by the accelerometer die 12, even though the accelerometer die 12 is positioned on an opposite side of the leadframe 8. For example, the processor 18 may perform various pre-processing functions, such as analog-to-digital conversion in some aspects. In various arrangements, the processor die 18 may also perform calculations to determine the acceleration, velocity, and/or position of the larger electrical system that incorporates the disclosed package 1.

Furthermore, the gyroscope die 15 may electrically couple to the processor die 18 by gyroscope bonding wires 33. Because the gyroscope die 15 is stacked on top of the processor die 18 in FIG. 1D, the gyroscope bonding wires 33 may directly couple to corresponding contact pads on the processor die 18. As with the accelerometer die 12, the processor die 18 may also receive and process signals detected by the gyroscope die 15. For example, the processor die 18 may perform pre-processing functions on signals received from the gyroscope die 15, such as analog-to-digital conversion. The processor die 18 may in some embodiments perform calculations to determine the orientation of the larger system that incorporates the disclosed package 1. In other embodiments, multiple processor dies may be used instead of the single processor die 18 shown in FIGS. 1C-1D. By incorporating both a gyroscope die 15 and an accelerometer die 12 (with associated processor(s)), the package 1 can provide robust motion sensing functions, including both acceleration/velocity/position information and orientation information.

Thus, the first leads 3a can advantageously provide die-to-die electrical communication among dies disposed on opposing sides of the leadframe 8. The inner portions 5 of the first leads 3a can advantageously act as interconnects to electrically couple device dies on opposite sides of the leadframe 8. Further, wire bonds can provide die-to-die communication for dies that are stacked on top of one another, such as the gyroscope die 15 and the processor die 18 shown in FIG. 1D. At the same time, the second leads 3b (FIG. 1C) can protrude from the package 1 and provide stress isolation. In some embodiments, one or more of the first leads 3a may not be wire bonded or electrically coupled to a device die.

In sum, as shown in FIG. 1D, the processor die 18 can receive and process signals from the gyroscope die 15 by way of direct wire bonds 33 between the gyroscope die 15 and the processor die 18. The processor die 18 can receive and process signals from the accelerometer die 12 by way of wire bonds 31, 35 that electrically couple to an inner portion 5 of a common first lead 3a (or to two leads that are shorted together). As shown in FIG. 1C, the processor die 18 (and the package 1 generally) can electrically communicate with the larger electronic system by wire bonds 31 that electrically couple to inner portions 5 of second leads 3b. The signals from the processor die 18 can be communicated to the system board of the larger system by way of the outer portions 7 of the second leads 3b, which can be integrally formed with the inner portions 5 of the second leads 3b. Accordingly, the embodiment shown in FIGS. 1A-1D can allow for a reduced package footprint by stacking the dies vertically relative to one another, while still providing robust electrical interconnects among all the dies of the package 1, electrical communication to the larger electronic system, and stress isolation by protruding leads.

Figure 2A:
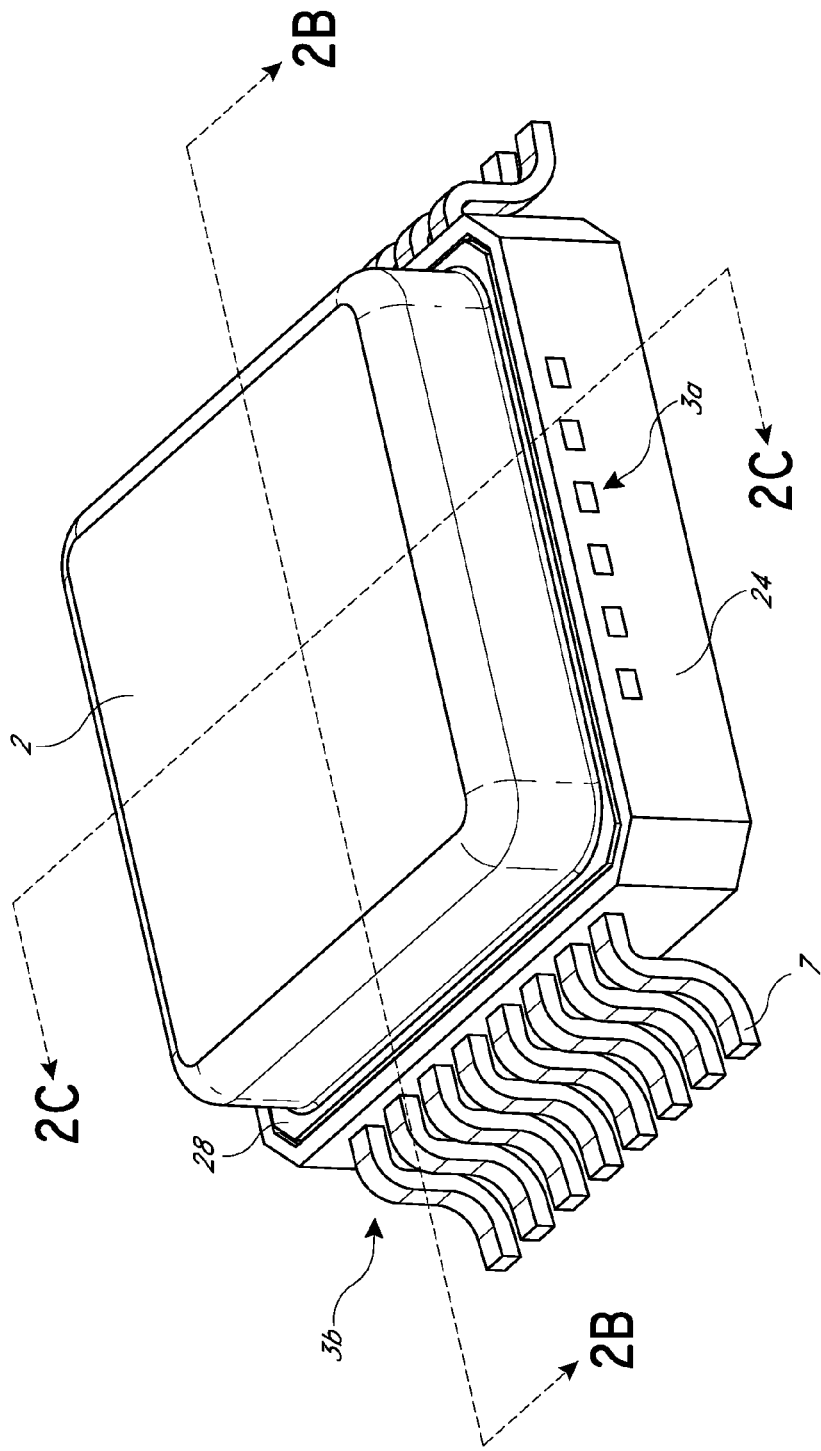
FIG. 2A is a three-dimensional perspective view of a double-sided integrated device package, according to another embodiment.
Figure 2B:
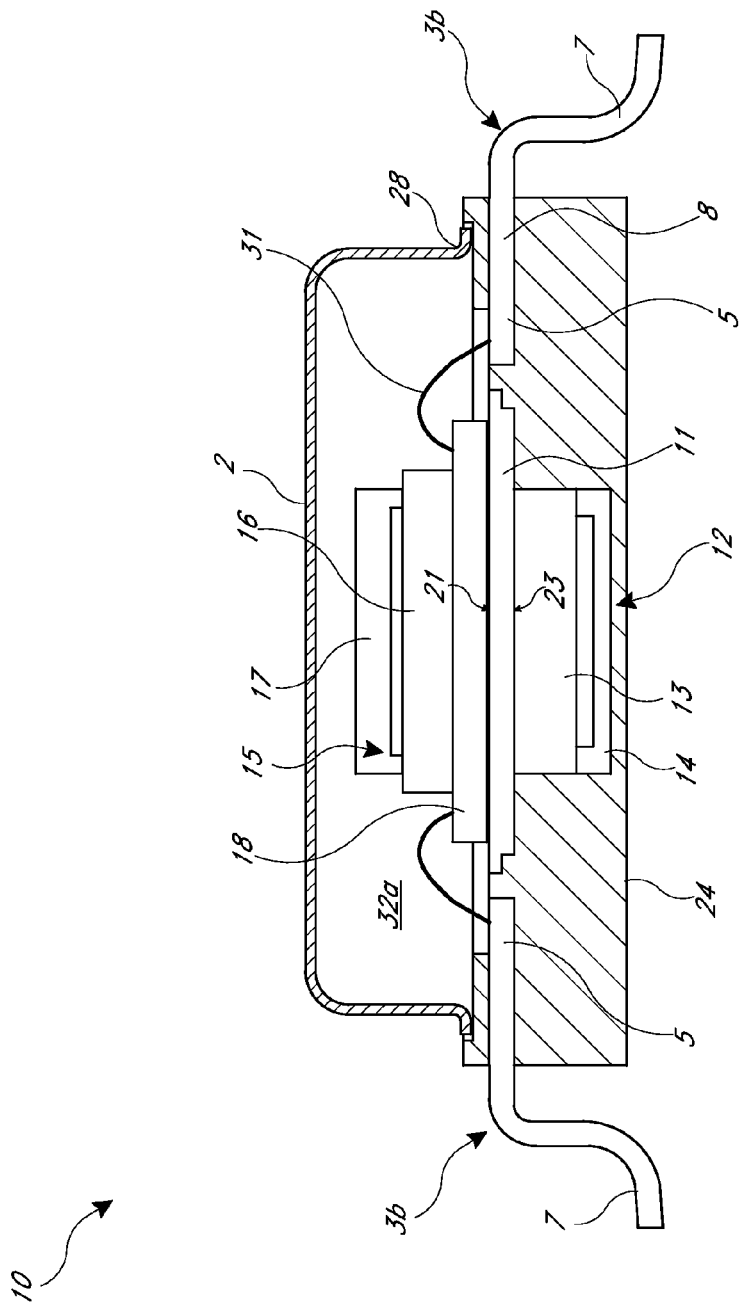
FIG. 2B is a side cross-sectional view of the integrated device package of FIG. 2A, taken along lines 2B-2B of FIG. 2A.
Figure 2C:
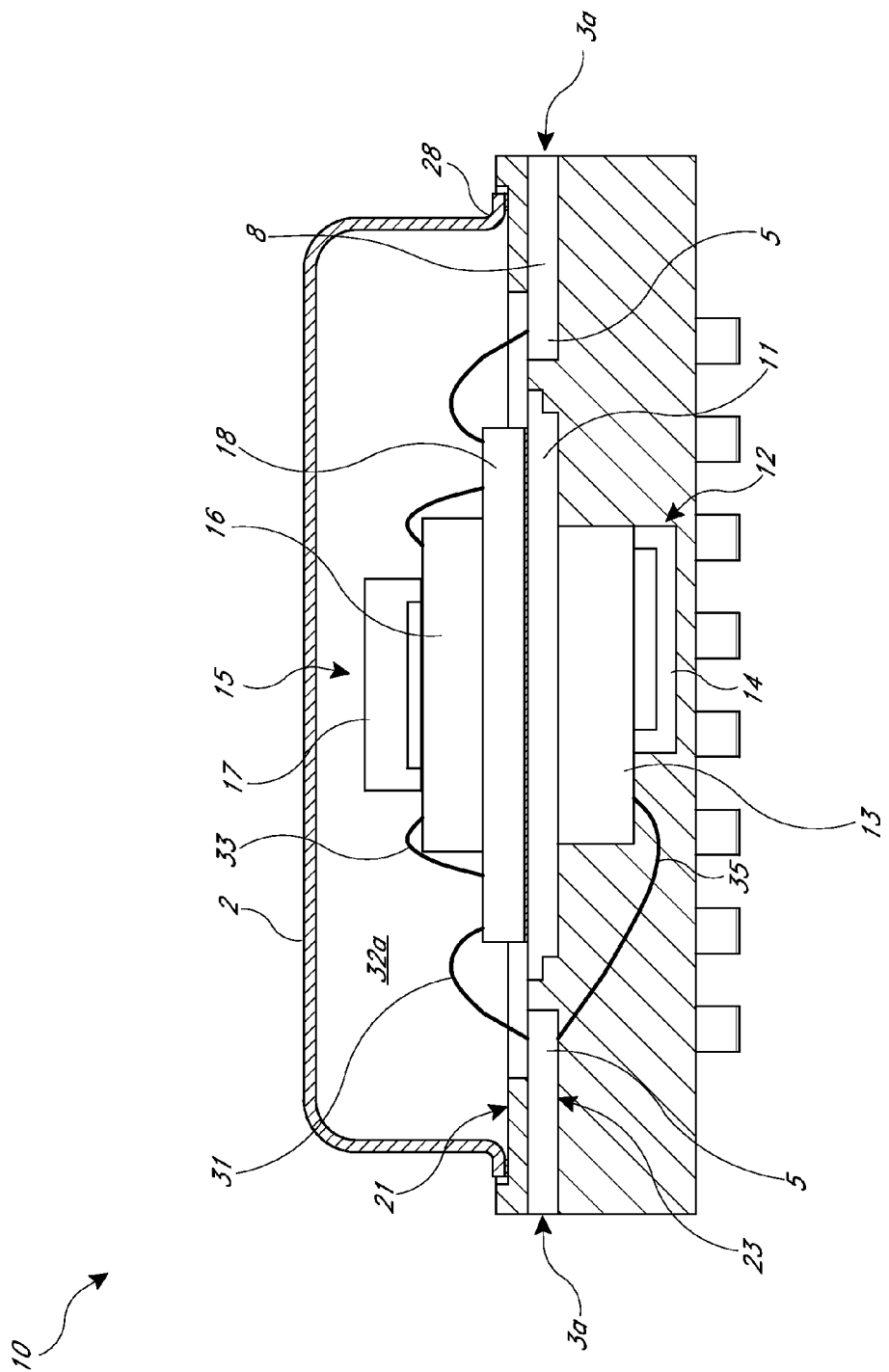
FIG. 2C is a side cross-sectional view of the integrated device package of FIG. 2A, taken along lines 2C-2C of FIG. 2A.

FIG. 2A is a three-dimensional perspective view of a double-sided integrated device package 10, according to another embodiment. FIG. 2B is a side cross-sectional view of the integrated device package 10 of FIG. 2A, taken along lines 2B-2B of FIG. 2A (e.g., presenting the second leads 3b in the illustrated cross-section). FIG. 2C is a side cross-sectional view of the integrated device package 10 of FIG. 2A, taken along lines 2C-2C of FIG. 2A (e.g., presenting the first leads 3a in the illustrated cross-section). Unless otherwise noted, the components of the package 10 of FIGS. 2A-2C are generally the same as those shown in FIGS. 1A-1D. However, unlike the embodiment of FIGS. 1A-1D, an encapsulant 24 is applied over the accelerometer die 12 on the bottom side 23 of the leadframe 8. As explained above, it can be advantageous to leave the gyroscope die 15 free from the stresses of encapsulant, so the top package lid 2 may be mounted to the molding material 9 to form the top cavity 32a. However, in some arrangements, the accelerometer die 12 may be less sensitive to stresses than the gyroscope die 15. Accordingly, in the embodiment of FIGS. 2A-2C, the bottom lid 4 shown in FIGS. 1A-1D is replaced by the encapsulant 24.

The encapsulant 24 can be formed of any suitable material. For example, the encapsulant 24 can be formed of a molding compound that is flowed over the accelerometer die 12 and cured until the encapsulant 24 hardens. In some arrangements, the encapsulant 24 can be formed from an epoxy or other suitable encapsulating material. The encapsulant 24 can protect the accelerometer die 12 from the outside environs without requiring the use of a second lid. The encapsulant 24 can thereby be used to protect the die(s) while reducing manufacturing costs associated with using a separate lid and/or with forming a vacuum seal. In other arrangements, a bottom lid can additionally be provided over the encapsulant, particularly where RF shielding is desired.

Furthermore, as illustrated in FIGS. 2A-2C, in some embodiments, the dies are mounted on the leadframe 8 (without a separate leadframe molding material). The encapsulant can be applied directly over the leadframe 8 to fill the spaces between the leads 3a, 3b, and between the leads 3a, 3b and the die attach pad 11, in addition to encapsulating the accelerometer die 12. Thus, the encapsulant 24 can serve to both mold the leadframe 8 and to encapsulate the die(s) (e.g., the accelerometer die 12). In other embodiments, the encapsulant 24 can be applied over a pre-molded leadframe 8, such that the encapsulant 24 is applied over the separate molding material 9 and the dies (e.g., the accelerometer die 12). In yet other arrangements, encapsulant may be applied on both sides of the package substrate, e.g., the leadframe 8, and dies on both sides of the package 10.

Figure 3A:
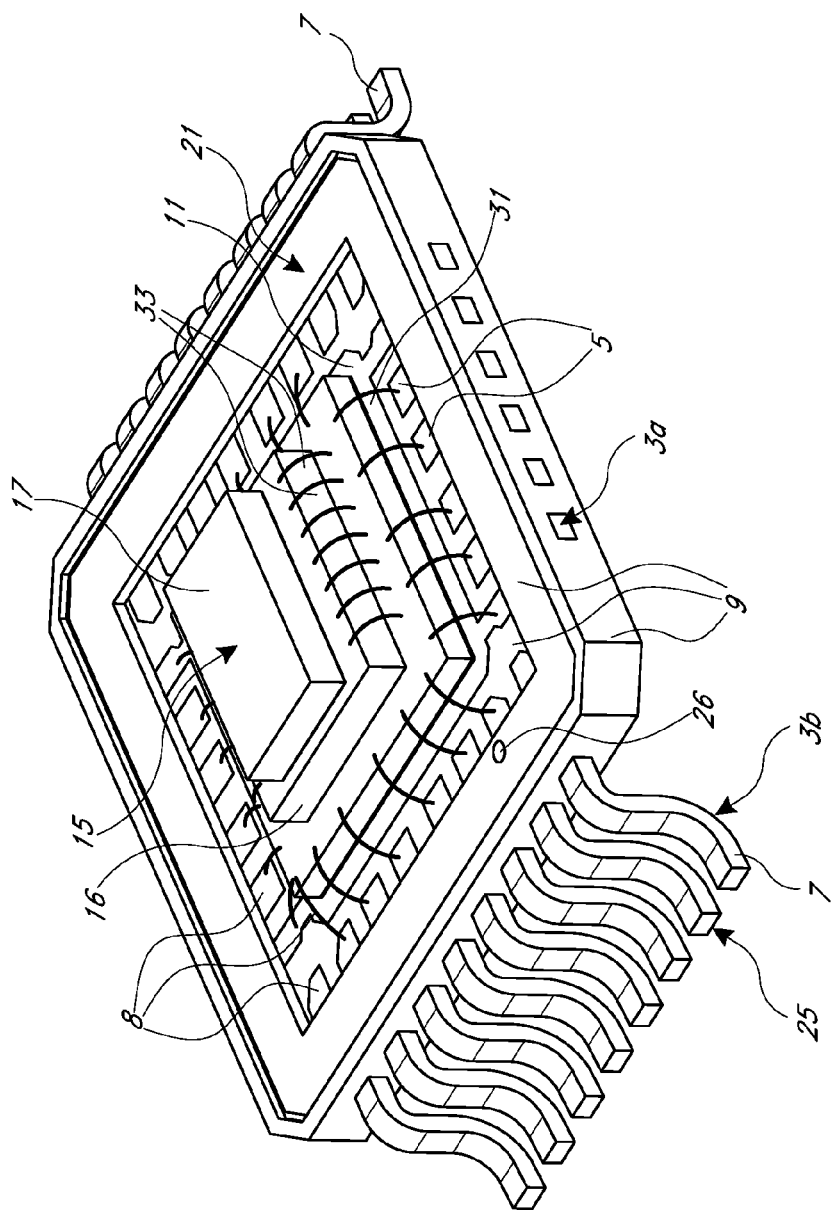
FIG. 3A is a top, three-dimensional perspective view of an integrated device package similar to those of FIGS. 1A-2B without package lid(s) and/or encapsulant.
Figure 3B:
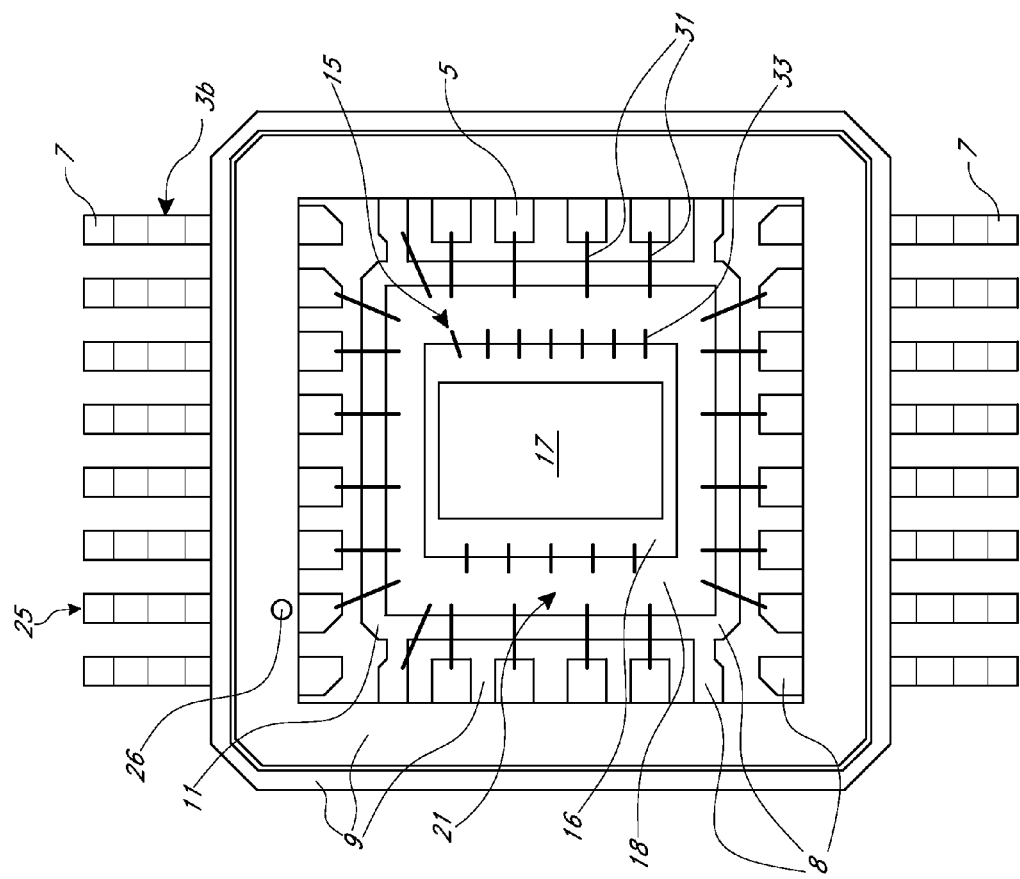
FIG. 3B is a top plan view of the integrated device package of FIG. 3A.
Figure 3C:
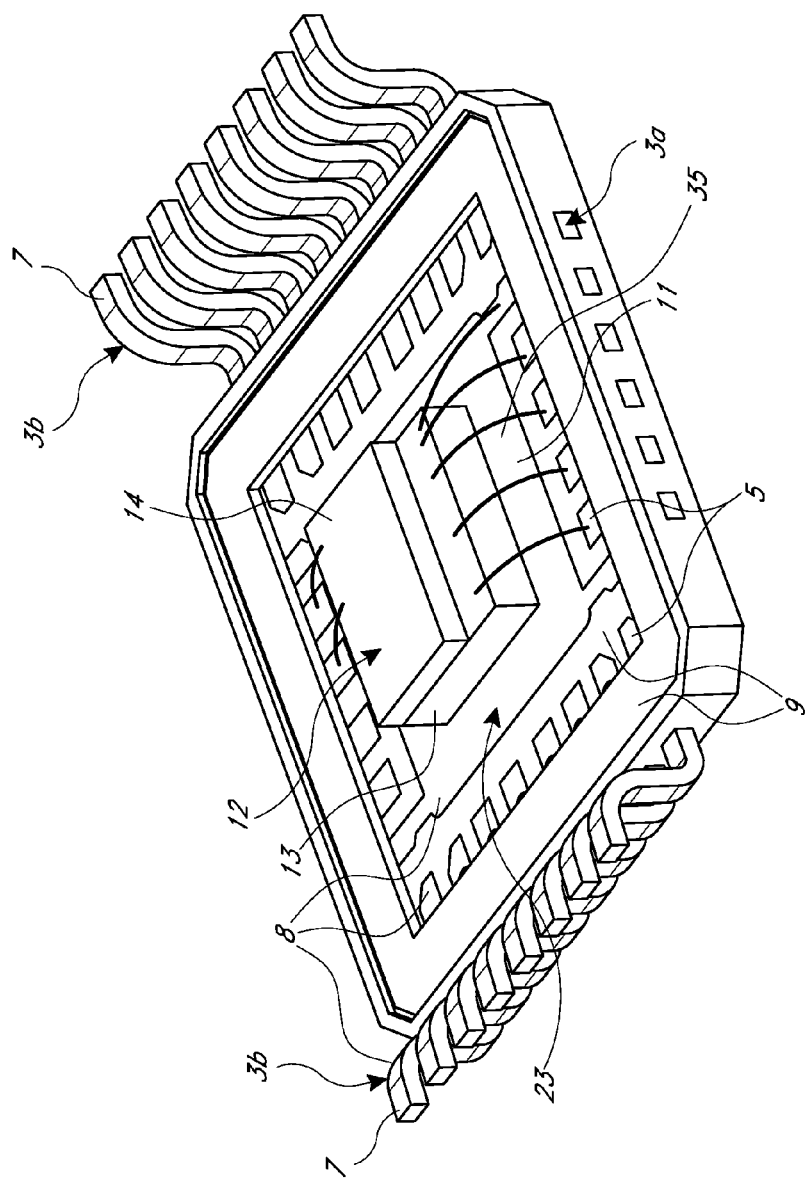
FIG. 3C is a bottom, three-dimensional perspective view of the integrated device package of FIG. 3A.
Figure 3D:
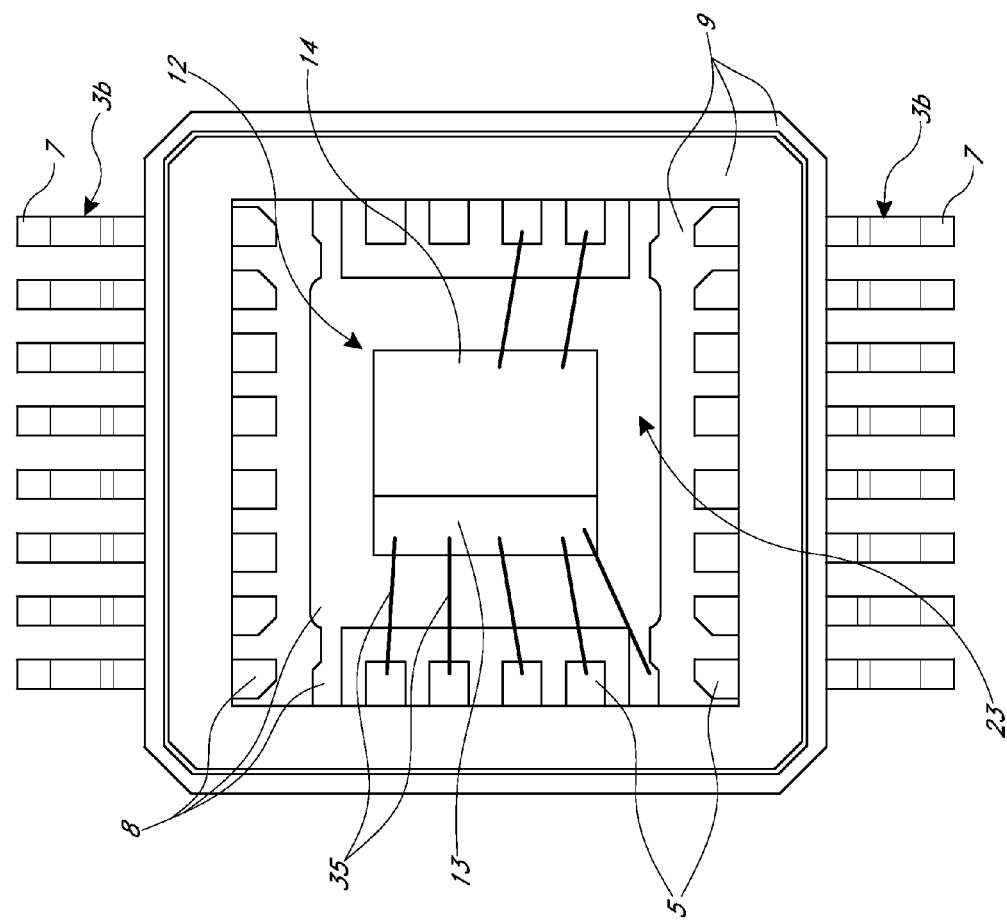
FIG. 3D is a bottom plan view of the integrated device package of FIG. 3C.

FIG. 3A is a top, three-dimensional perspective view of an integrated device package similar to those of FIGS. 1A-2B without a package lid(s) and/or encapsulant. FIG. 3B is a top plan view of the partially-fabricated integrated device package of FIG. 3A. FIG. 3C is a bottom, three-dimensional perspective view of the partially-fabricated integrated device package of FIG. 3A. FIG. 3D is a bottom plan view of the partially-fabricated integrated device package of FIG. 3C. Unless otherwise noted, the components shown in FIGS. 3A-3D are the same as those illustrated and described above with respect to FIGS. 1A-2B.

A lid adhesive (not shown) can be applied around the perimeter of the molding material 9 formed on the top side 21 of the package substrate. The lip 28 of the top lid 2 (see, e.g., FIGS. 1A-1D) can be adhered to the molding material 9 using the adhesive. For example, the lid adhesive can be an epoxy or any other suitable adhesive. Similarly, in FIGS. 3C and 3D, for packages that utilize two package lids, the lid adhesive can also be applied around the perimeter of the molding material 9 formed on the bottom side 23 of the package substrate. The lip 28 of the bottom lid 4 can be adhered to the molding material 9 using the adhesive.

As explained above, it can be advantageous to provide an electromagnetic shielding capability in some embodiments. For example, it can be advantageous to shield the processor die 18 from RF radiation generated by other device dies in the package and/or in the larger electrical system, and/or to shield the other devices in the package from RF radiation generated by the processor die 18. As best illustrated in FIGS. 3A-3B, a through-mold via 26 can be formed through the thickness of the molding material 9. The through-mold via 26 can essentially be formed as a hollow through-hole in the molding material 9. The through-mold via 26 can be any suitable shape. For example, the illustrated through-mold via 26 is circular in shape, although the via 26 can instead be any other shape, such as rectangular, triangular, etc. The through-mold via 26 can thereby extend from a top surface of the molding material 9 (e.g., the top side 21 of the package substrate) through to a top surface of a ground lead 25 that is configured to be electrically coupled to ground. For example, the ground lead 25 that is associated with the through-mold via 26 can electrically couple to a grounded bond pad on the external system board. The through-mold via 26 can be filled with a conductive material, such as a conductive epoxy or solder, that can provide electrical communication between the ground lead 25 and the top lid 2, e.g., to ground the top lid 2. In some arrangements, the conductive adhesive may also be used as the lid adhesive, such that it bonds the lid to the molding material 9, while also filling the through-mold via 26 to provide electrical communication to ground. Grounding the top lid 2 can create a Faraday cage to provide an RF shield for the processor die 18. It should be appreciated that while the through-mold via 26 is illustrated as providing electrical communication only to the top side 21 of the package substrate, a similar through-mold via may be provided on the opposite side of the package substrate to provide electrical communication between a bottom surface of the ground lead 25 and the bottom lid 4 if RF shielding is also desired on the bottom side.

Figure 4A:
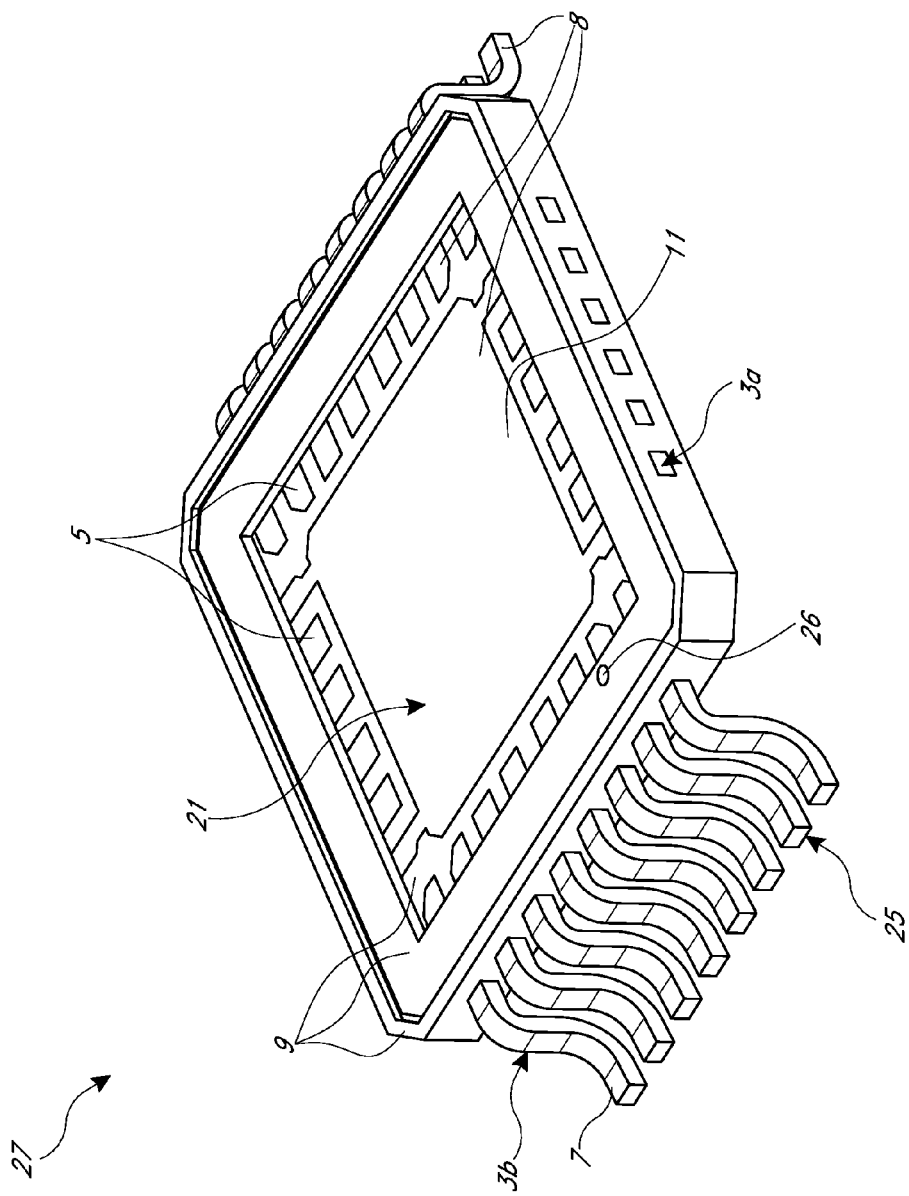
FIG. 4A is a three-dimensional perspective view of a pre-molded leadframe configured for use in the packages of FIGS. 1A-3D.
Figure 4B:
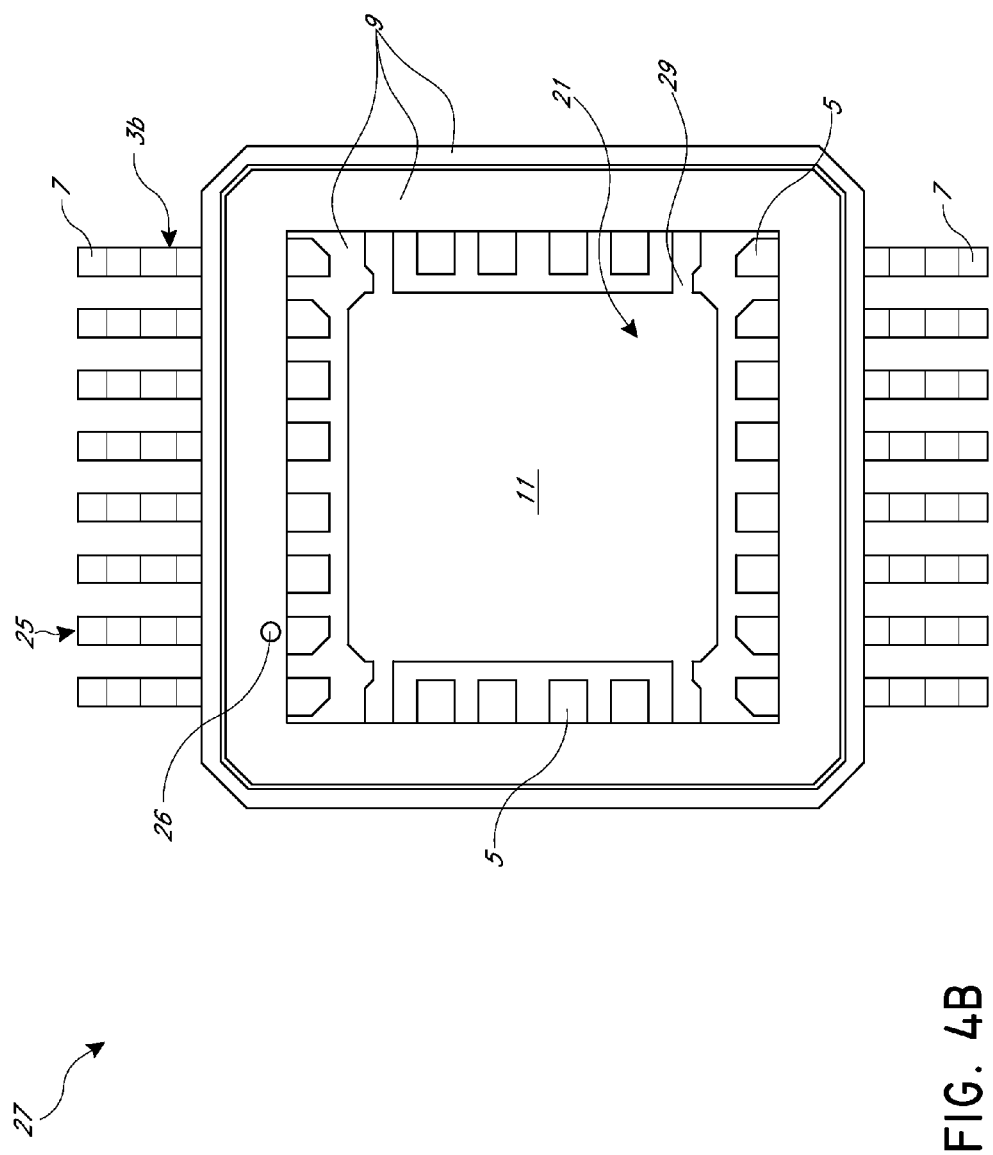
FIG. 4B is a top plan view of the pre-molded leadframe of FIG. 4A.
Figure 4C:
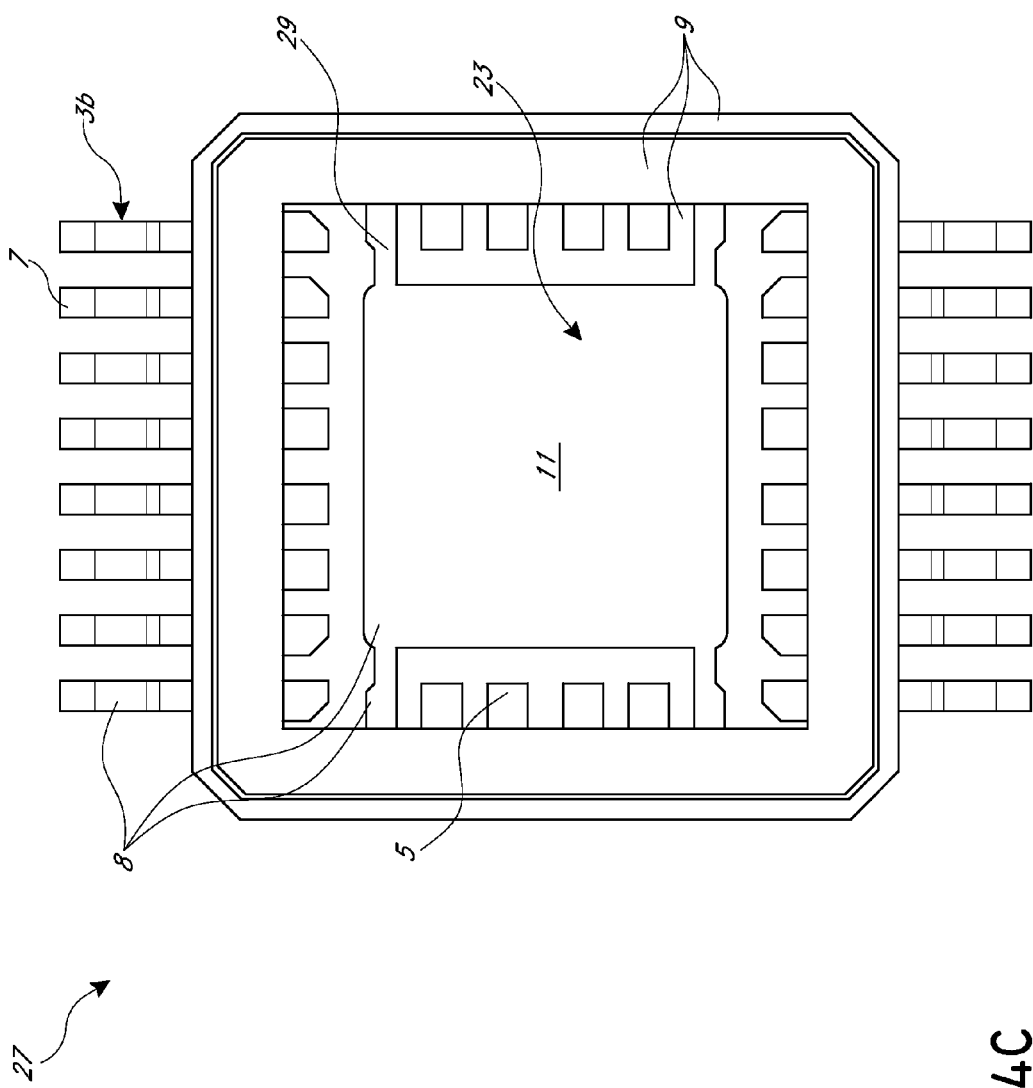
FIG. 4C is a bottom plan view of the pre-molded leadframe of FIG. 4A.

FIG. 4A is a three-dimensional perspective view of a portion of a pre-molded leadframe 27 configured for use in the packages of FIGS. 1A-3D. FIG. 4B is a top plan view of the portion of the pre-molded leadframe 27 of FIG. 4A. FIG. 4C is a bottom plan view of the portion of the pre-molded leadframe 27 of FIG. 4A. Unless otherwise noted, the components shown in FIGS. 4A-4C are the same as those illustrated and described above with respect to FIGS. 1A-3D. The pre-molded leadframe 27 of FIGS. 4A-4C can include the leadframe 8 embedded in the molding material 9. As explained above, the molding material 9 can provide structural support for the pre-molded leadframe 27. In some arrangements, for example, the leadframe manufacturer may pattern the leadframe 8 and apply the molding material 9 over the leadframe 8 to form the pre-molded leadframe 27. This may be done, for example, prior to singulation while the leadframe device cells are still connected to one another in an array. In other arrangements, the leadframe 8 may be molded when one or more dies are encapsulated with an encapsulant. The package assembler (which may be the same or a different entity from the leadframe manufacturer) may then mount the device dies (such as the motion sensor dies and the processor die(s)) to the die attach pad 11 in any suitable configuration. It should be appreciated that the outer portions 7 of the second leads 3b may not be bent before the pre-molded leadframe 27 is dispatched to the package assembler. Furthermore, in some arrangements, the first leads 3a may also include outer lead portions similar to the outer lead portions 7 of the second leads 3b. The outer lead portions of the first leads 3a may be cut or otherwise removed such that the ends of the inner portions 5 of the first leads 3a are substantially flush with the exterior surface of the molding material 9, such as during saw singulation. Furthermore, as shown in FIGS. 4B-4C, tie bars 29 may also be formed in the leadframe 8 to support the die attach pad 11 before singulation. The tie bars 29 may extend from the die attach pad 11 to an outer frame member of the leadframe 8 (not shown in FIGS. 4A-4C; see FIG. 6).

Figure 5A:
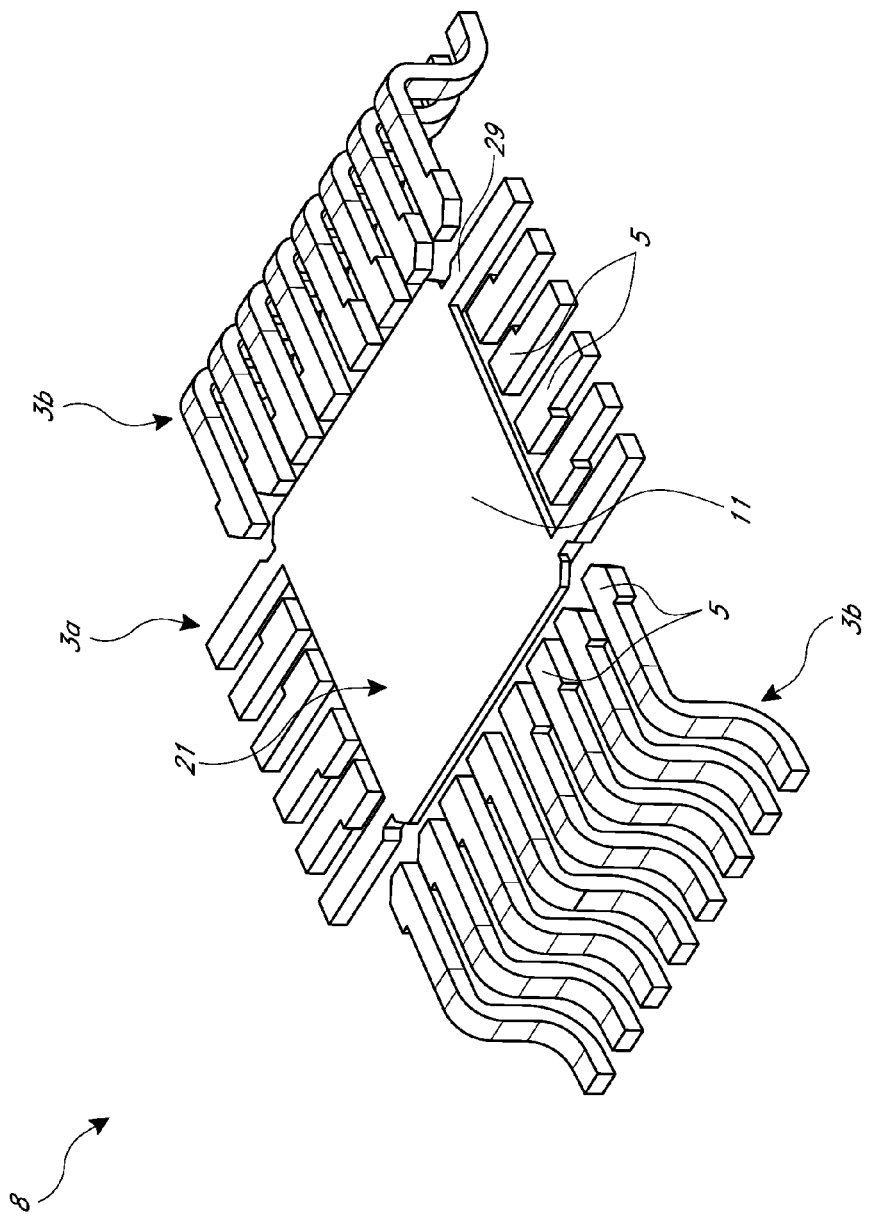
FIG. 5A is a three-dimensional perspective view of the leadframe of FIGS. 4A-4C, shown without the molding material.
Figure 5B:
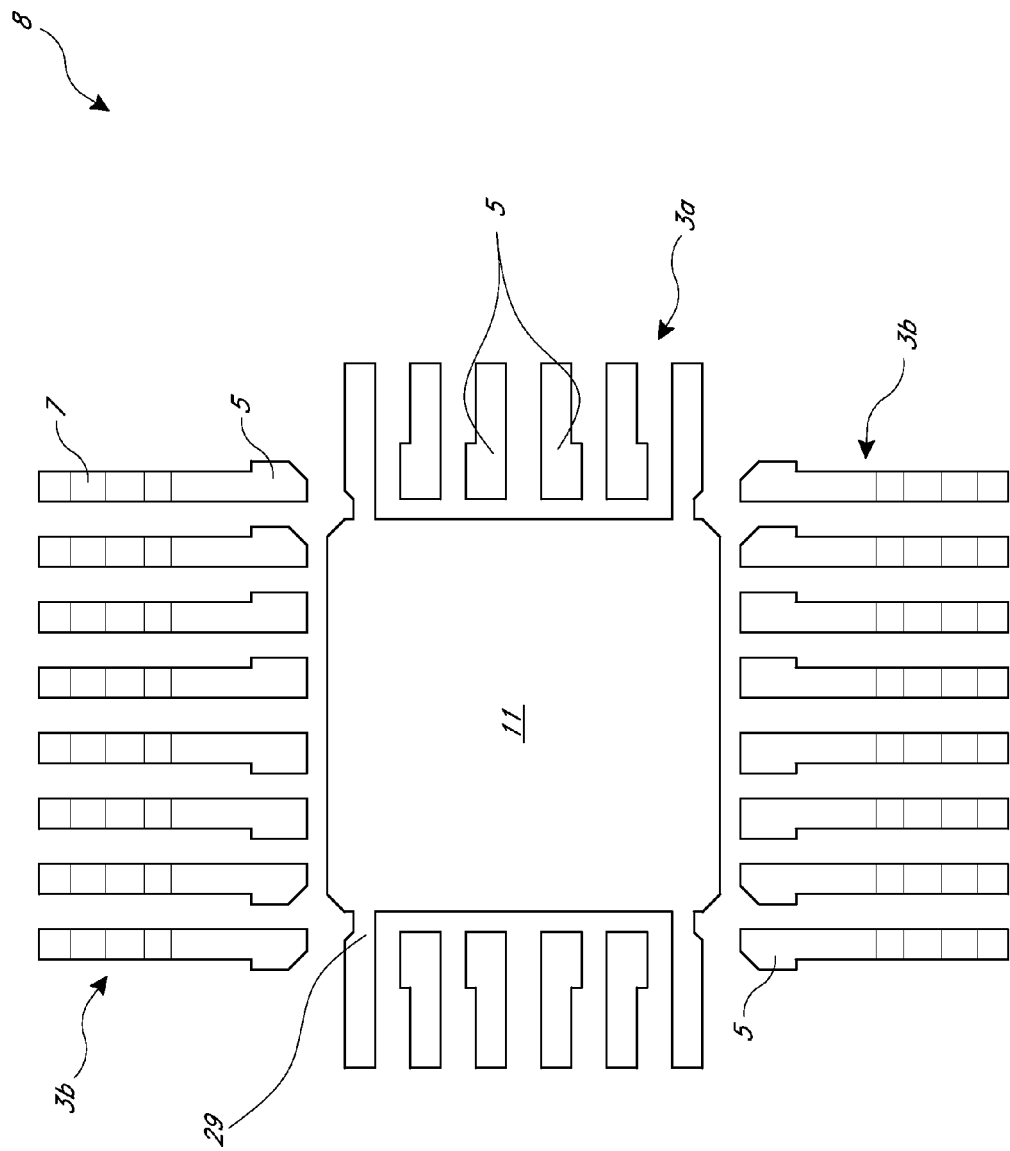
FIG. 5B is a top plan view of the leadframe of FIG. 5A.

FIG. 5A is a three-dimensional perspective view of a portion of the leadframe 8 of FIGS. 4A-4C, shown without the molding material 9 for purposes of illustration. FIG. 5B is a top plan view of the leadframe 8 of FIG. 5A. As explained above, the portion of the leadframe 8 associated with the package 1, 10 can include a die attach pad 11 or die mounting region that is surrounded by a plurality of leads 3a, 3b. The first leads 3a can include inner portions 5, and the second leads 3b can include both inner portions 5 and outer portions 7 configured to electrically couple to an external system board. The outer portions 7 of the second leads 3b can be downwardly bent to facilitate soldering to the system board, which can advantageously improve solder joint reliability and can isolate the die(s) mechanical stresses, such as those exerted on the package in use or during soldering. As with FIGS. 4A-4C, tie bars 29 can be provided to support the die attach pad 11 before singulation (see FIG. 6).

Figure 6:
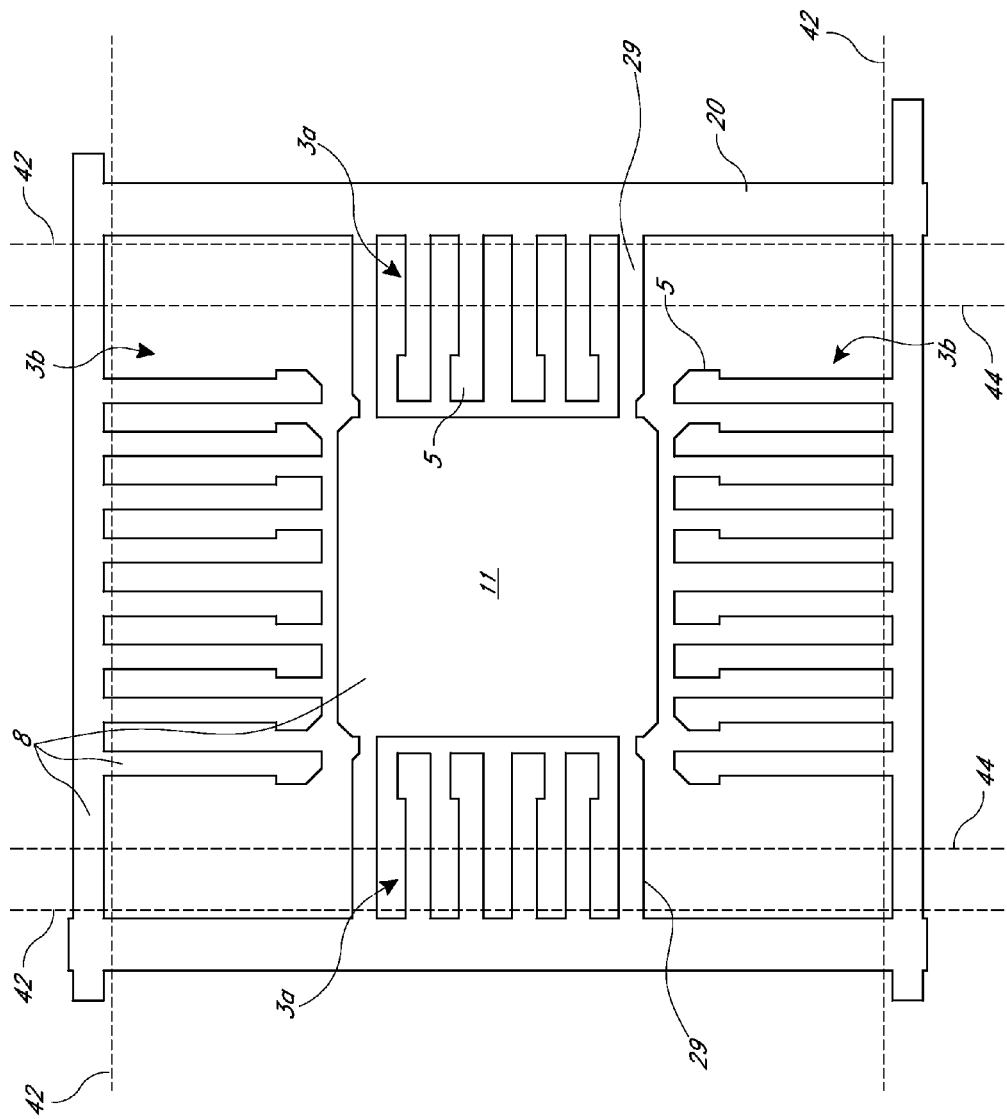
FIG. 6 is a top plan view of a leadframe device cell before singulation, shown without the molding material.

FIG. 6 is a top plan view of a leadframe device cell 34 before singulation, shown without the molding material for purposes of illustration. It should be appreciated that the leadframe 8 can include an array of leadframe device cells 34 that can be singulated after package assembly to form multiple integrated device packages 1, 10. As explained above, an outer frame member 20 can support the leadframe device cell 34 before singulation. For example, the leads 3a, 3b can extend inwardly toward the die attach pad 11 from the outer frame member 20 such that there is a separation between distal ends of the leads 3a, 3b and the die attach pad 11. As shown in FIG. 6, prior to singulation, the outer portions of the leads 3a, 3b may not be downwardly bent; instead, the leads 3a, 3b are substantially planar. Further, tie bars 29 can extend from the outer frame member 20 to the die attach pad 11 to support the die attach pad 11 before singulation.

After the package has been assembled (e.g., after molding, die mounting, wire bonding and mounting the lid(s)), the leadframe device cell 34 can be singulated by sawing along singulation saw streets 42. Cutting along the singulation saw streets 42 can thereby electrically isolate the leads 3a, 3b from one another and from the die attach pad 11. Furthermore, cutting along the singulation saw streets 42 can sever the tie bars 29, which remain embedded in the molding material (not shown). As shown in FIG. 6, the first leads 3a may initially include outer lead portions similar to those shown above for the second leads 3b. To remove the outer portions, cuts may be made along lead saw streets 44 that pass along the middle portions of the first leads 3a. In general, the cuts along the lead saw streets 44 are made after application of the molding material such that the ends of the first leads 3a are substantially flush with the exterior of the molding material. The manufacturer may opt to employ saw streets 42 in both dimensions, omitting saw streets 44, if desired to have protruding leads on three or four sides of the package.

Figure 7:
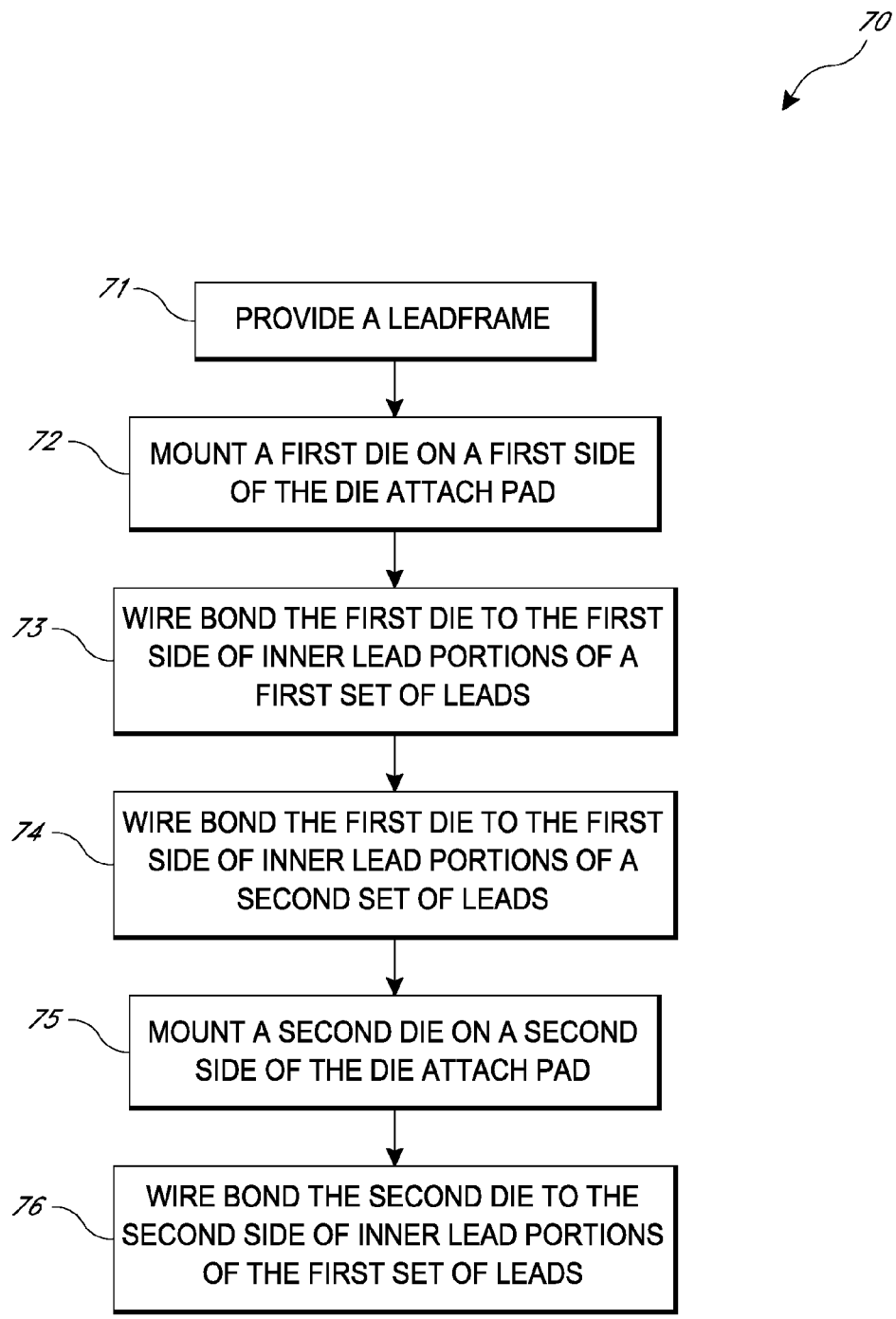
FIG. 7 is a flowchart illustrating a method for packaging an integrated device, according to one embodiment.

FIG. 7 is a flowchart illustrating a method 70 for packaging an integrated device. The method 70 can begin in a block 71 to provide a leadframe. As explained above, the leadframe can have a first side and a second side opposite the first side. The leadframe can include a die attach pad and a first set of leads surrounding the die attach pad and having an inner lead portion. Further, the leadframe can comprise a second set of leads surrounding the die attach pad and having an inner lead portion and an outer lead portion. The outer lead portion can be configured to electrically couple to a mounting board. For example, in some arrangements, the outer lead portions of the second set of leads may have a length for subsequently bending downwardly to facilitate soldering to the system board. A leadframe device cell may be connected to other leadframe device cells in a leadframe array, each of which can include molding material to form a molded leadframe.

The method 70 then moves to a block 72 to mount a first die on a first side of the die attach pad. The first die can be any suitable die, such as a processor die or a sensor die. For example, in one embodiment, the first die is a processor die, such as an ASIC. The first die can be mounted to the first side of the die attach pad using any suitable method, such as by adhering the first die to the die attach pad using an adhesive.

Turning to a block 73, the first die can be wire bonded to the first side of the inner lead portions of the first set of leads. As explained above, the inner portions of the first set of leads may be configured to provide die-to-die communication among device dies mounted on opposing sides of the die attach pad. The method 70 moves to a block 74 to wire bond the first die to the first side of inner lead portions of the second set of leads. The second set of leads can be configured to provide electrical communication between the package (e.g., the first die) and the system board. For example, the outer lead portions can be soldered to the system board to provide electrical communication between the inner lead portions of the second leads and the system board.

Turning to a block 75, a second die is mounted on the second side of the die attach pad. The second die can be any suitable die, such as a processor die or a sensor die. As in the embodiments of FIGS. 1A-3D, the second die can be an inertial motion sensor die such as an accelerometer die, for example. The accelerometer die can include an accelerometer device and an accelerometer cap to protect the accelerometer device. In some arrangements, the cap can be electrically active or conductive to provide additional functionality to the package. The second die can be mounted to the die attach pad using any suitable adhesive. Moving to a block 76, the second die can be wire bonded to the second side of the inner lead portions of the first set of leads. The second die can therefore electrically communicate with the first die by way of bonding wires that couple to a common lead from the first set of leads. For example, in some embodiments, an accelerometer die can electrically communicate with a processor die on the opposite side of the die attach pad.

In some embodiments, a third die can be stacked on top of or under the first die or the second die. For example, an inertial motion sensor die, such as a gyroscope die, can be stacked on top of a processor die on the first side. To communicate with the processor die, the gyroscope die can be wire bonded to the processor die. The processor die can therefore receive and process signals received from both the second die (e.g., accelerometer) and the gyroscope die. A first package lid can be mounted on the first side of the leadframe to form a first cavity and to enclose the processor die and the gyroscope die within the first cavity. In some embodiments, a second package lid can be mounted on the second side of the leadframe to form a second cavity and to enclose the accelerometer die. In some embodiments, a molding material can be applied over the second side of the leadframe to encapsulate the first motion sensor die. If the leads in the first set include outer lead portions, the outer lead portions of the leads in the first set of leads can be removed by, e.g., sawing along lead saw streets. Additionally, the second set of leads can be shape, e.g., bent down, after singulation.

Figure 8:
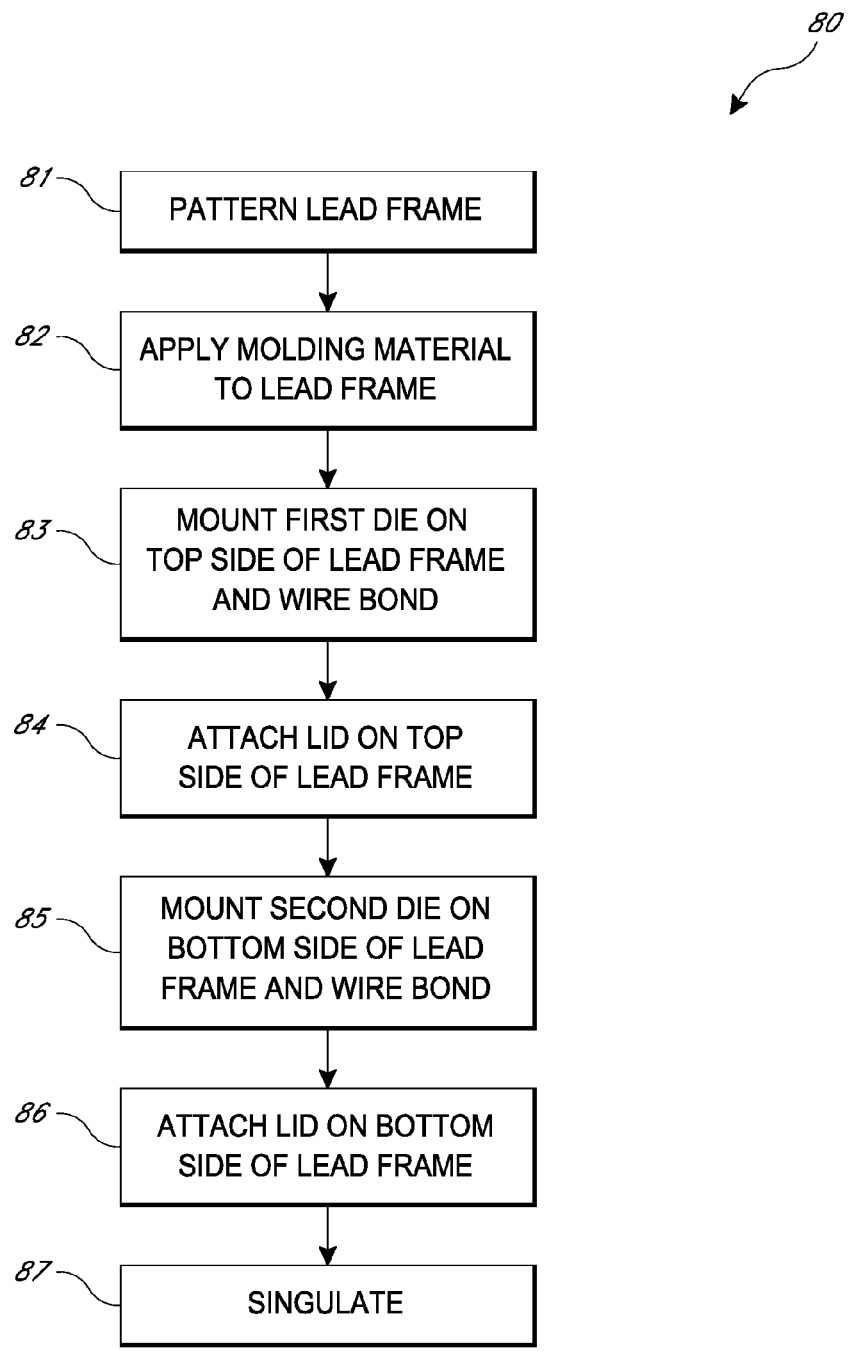
FIG. 8 is a flowchart illustrating a method for packaging an integrated device, according to another embodiment.

FIG. 8 is a flowchart illustrating a method 80 for packaging an integrated device, according to another embodiment. The method 80 begins in a block 81 to pattern a leadframe. As explained herein, the leadframe (one example of a package substrate) can be patterned to form an array of leadframe device cells. Each leadframe device cell can include a die attach pad and a plurality of leads electrically spaced apart from the die attach pad. In various embodiments, the leadframe can be patterned by etching, although other suitable patterning techniques may be suitable.

The method 80 then moves to a block 82 to apply a molding material to the leadframe. The molding material can be applied in liquid form and cured to harden the molding material. The molding material can be applied between the individual leads, and between the leads and the die attach pad.

Turning to a block 83, a first integrated device die can be mounted on a top side of the leadframe and wire bonded to inner lead portions of the leads. As explained herein, the first integrated device die can be any suitable device. For example, the first integrated device die can be a motion sensor die in some arrangements. As an example, the first integrated device die can be a MEMS motion sensor die, such as an accelerometer die or a gyroscope die. In other arrangements, the first integrated device die can be a processor die, such as an ASIC. As explained herein, the first integrated device die can be wire bonded to inner lead portions of a first set of leads to provide electrical communication between the first integrated device die and any device dies that are mounted on the opposite, bottom surface of the leadframe. The first integrated device die can be wire bonded to inner lead portions of a second set of leads to provide electrical communication with the external system, such as a system motherboard.

In a block 84, a first lid can be attached on the top side of the leadframe. The first lid can be mounted over the first integrated device die and can form a first cavity. The first lid can provide mechanical protection to the first integrated device die. In some embodiments, the first lid can act as an RF shield. An adhesive can be used to attach the first lid to the top side of the leadframe.

Turning to a block 85, a second integrated device die can be mounted to a bottom side of the leadframe. As above, the second die can be any suitable device die, such as a motion sensor die. For example, the second die can be a MEMS motion sensor die, such as an accelerometer die or a gyroscope die. The second die may also be a processor die in some arrangements. The second die can be wire bonded to inner portions of the leads. For example, the second die can be wire bonded to inner lead portions of the first set of leads to electrically communicate with the dies (e.g., the first die) on the top side of the leadframe. In addition, in some arrangements, the second die can be wire bonded to inner lead portions of a second set of leads to electrically communicate with the external system.

In a block 86, a second lid can be attached on the bottom side of the leadframe. The second lid can mechanically protect the second die and can isolate the second die from stresses induced by the package. In addition, the second lid can act as an RF shield. As with the first lid, the second lid can be attached using an adhesive. In a block 87, the array of leadframe device cells can be singulated to form a plurality of device packages. For example, a saw can be used to cut along saw streets and mechanically separate the individual packages.

Figure 9:
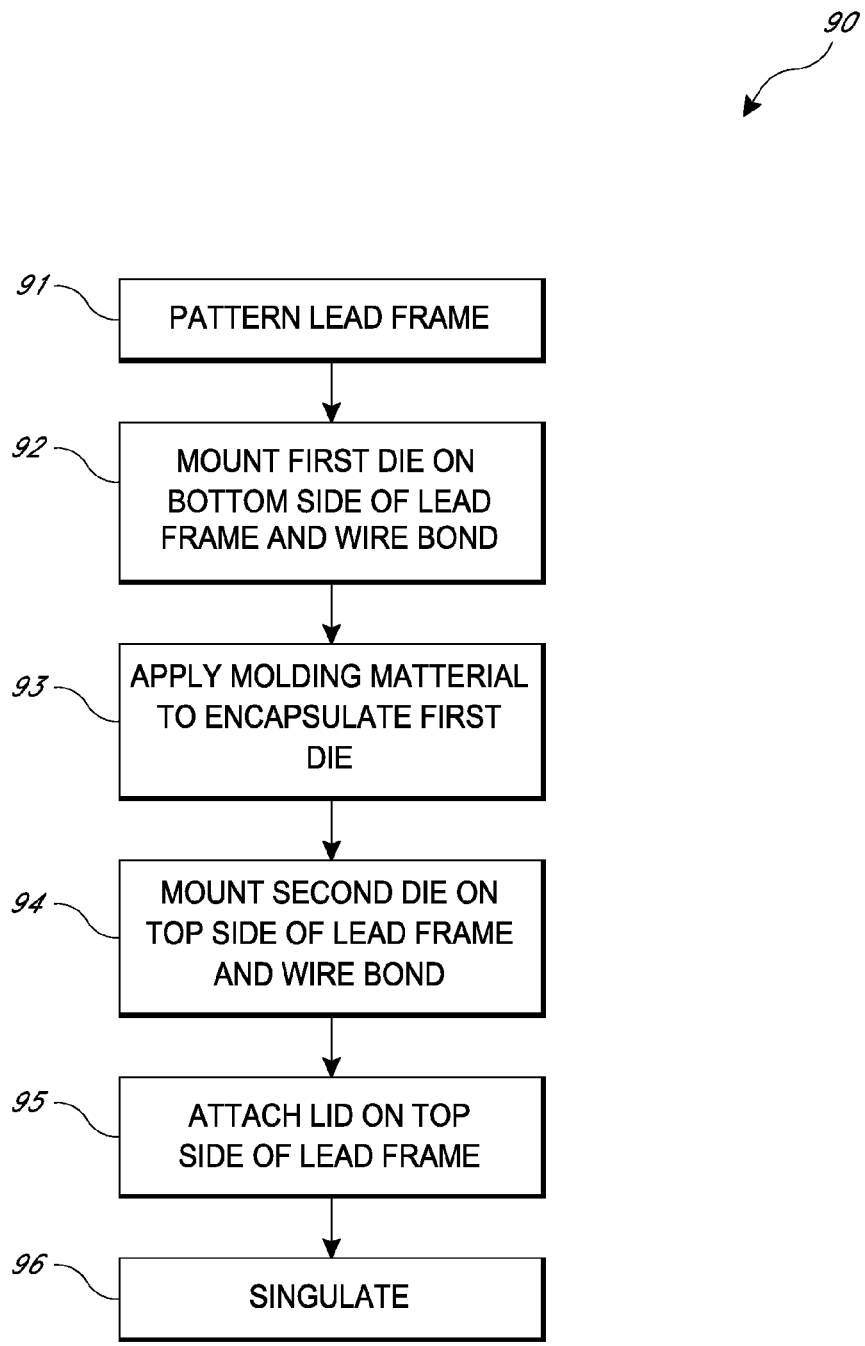
FIG. 9 is a flowchart illustrating a method for packaging an integrated device, according to yet another embodiment.

FIG. 9 is a flowchart illustrating a method 90 for packaging an integrated device, according to yet another embodiment. The method 90 begins in a block 91 to pattern a leadframe. As with the block 81 of FIG. 8, the leadframe can be patterned to form an array of leadframe device cells. Each leadframe device cell can include a die attach pad and a plurality of leads electrically spaced apart from the die attach pad. In various embodiments, the leadframe can be patterned by etching, although other suitable patterning techniques may be suitable.

The method 90 then moves to a block 92 to mount a first integrated device die on a bottom side of the leadframe and wire bond the first die to the leads. The first integrated device can be any suitable device die, as explained with respect to blocks 83 and 85 of FIG. 8, and can be wire bonded as explained above with respect to FIG. 8.

Turning to a block 93, a molding material can be applied to encapsulate the first die. In some arrangements, the leadframe is not pre-molded with a molding material. In such arrangements, the molding material applied in block 93 can encapsulate the first die and can act to mold the leadframe. For example, the applied molding material can both cover the first die and fill the spaces between the leads and between the leads and the die attach pad. In other embodiments, however, the leadframe is pre-molded with a molding material. In such embodiments, the molding material or encapsulant applied in the block 93 can be applied over the molding material previously applied to the leadframe. In various embodiments, the molding material can be applied in liquid form and cured to harden.

The method 90 then moves to a block 94 to mount a second integrated device die on a top side of the leadframe and to wire bond the second die to the leads. The second die can be any suitable die, as explained above with respect to the block 92. Further, the second die can be wire bonded to the leads as explained with respect to block 92.

Turning to a block 95, a lid can be applied on the top side of the leadframe. The lid can substantially enclose the second die and can form a cavity between the lid and the leadframe. The cavity formed by the lid can act to separate the die from the lid and to isolate the die from stresses induced by the package on the die. Further, the lid can act as an RF shield in some arrangements. The method 90 then moves to a block 96 to singulate the leadframe array. As above, a saw can be applied along saw streets to separate the array into multiple individual packages.

It should be appreciated that the steps of the methods 70, 80 and 90 of FIGS. 7-9 are illustrated in particular sequences for illustration purposes only. Skilled artisans will understand that the steps of the methods 70, 80, 90 can be performed in any suitable order. Further, in some arrangements, the methods 70, 80, 90 can include additional intervening steps not illustrated in FIGS. 7-9.

APPLICATIONS

Devices employing the above described schemes can be implemented into various electronic devices. Examples of the electronic devices can include, but are not limited to, consumer electronic products, parts of the consumer electronic products, automobiles (and/or controllers for automobiles), electronic test equipment, medical devices, etc. Examples of electronic products can include, but are not limited to, a mobile phone, a hearing aid, a wearable electronic device (such as a watch or bandage) that includes one or more biological monitoring sensors, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
a leadframe having a first side and a second side opposite the first side, the leadframe including a plurality of leads surrounding a die mounting region;
a first package lid mounted on the first side of the leadframe to form a first cavity, wherein the first package lid is electrically grounded to form a radio frequency (RF) shield;
a first integrated device die mounted on the first side of the leadframe within the first cavity; and
a second integrated device die mounted on the second side of the leadframe, wherein at least one lead of the plurality of leads is a common lead that provides direct and physical electrical communication between the first integrated device die and the second integrated device die such that an electrical signal can pass between the first integrated device die and the second integrated device die by way of the common lead.

2. The integrated device package of claim 1, wherein the first integrated device die is a processor die and the second integrated device die is a sensor die.

3. The integrated device package of claim 1, further comprising a third integrated device die mounted on the first side of the leadframe adjacent the first integrated device die.

4. The integrated device package of claim 1, further comprising a third integrated device die stacked on top of the first integrated device die such that the first integrated device die is disposed between the third integrated device die and the leadframe.

5. The integrated device package of claim 4, wherein the first integrated device die is a processor die, and the second and third integrated device dies are inertial motion sensor dies.

6. The integrated device package of claim 5, wherein the second integrated device die is an accelerometer die, and the third integrated device die is a gyroscope die.

7. The integrated device package of claim 6, further comprising a second package lid mounted on the second side of the leadframe to form a second cavity, the accelerometer die positioned within the second cavity.

8. The integrated device package of claim 6, further comprising an encapsulant applied over the second side of the leadframe to encapsulate the accelerometer die.

9. The integrated device package of claim 6, wherein the gyroscope die and the accelerometer die are microelectromechanical systems (MEMS) dies.

10. The integrated device package of claim 4, wherein the plurality of leads includes a first set of leads and a second set of leads, wherein the second integrated device die is wire bonded to the second side of one or more inner lead portions of the first set of leads, and wherein the first integrated device die is wire bonded to the first side of the one or more inner lead portions of the first set of leads to provide electrical communication between the first integrated device die and the second integrated device die.

11. The integrated device package of claim 10, wherein the first integrated device die is wire bonded to one or more inner lead portions of the second set of leads, the second set of leads further including outer lead portions protruding outwardly from a body of the integrated device package, the outer lead portions configured to electrically couple to a mounting board to provide electrical communication between the integrated device package and the mounting board.

12. The integrated device package of claim 4, wherein the third integrated device die is wire bonded to the first integrated device die.

13. An integrated device package comprising:
a leadframe having a first side and a second side opposite the first side, the leadframe including a plurality of leads surrounding a die mounting region;
a first package lid mounted on the first side of the leadframe to form a first cavity;
a first integrated device die mounted on the first side of the leadframe within the first cavity; and
a second integrated device die mounted on the second side of the leadframe, wherein at least one lead of the plurality of leads provides electrical communication between the first integrated device die and the second integrated device die,
wherein the leadframe is molded in a molding material, the molding material including a via formed therethrough and filled with a conductive material to provide electrical communication between the first package lid and one lead of the plurality of leads.

14. A method of packaging an integrated device, the method comprising:
providing a leadframe having a first side and a second side opposite the first side, the leadframe including a die attach pad, a first set of leads adjacent the die attach pad and having an inner lead portion, and a second set of leads adjacent the die attach pad and having an inner lead portion and an outer lead portion, the outer lead portion configured to electrically couple to a mounting board;
mounting a first integrated device die on the first side of the die attach pad;
wire bonding the first integrated device die to the first side of the inner lead portions of at least some leads in the first set of leads;
wire bonding the first integrated device die to the first side of the inner lead portions of at least some leads in the second set of leads;
mounting a first package lid on the first side of the leadframe to form a first cavity, wherein the first package lid is electrically grounded to form a radio frequency (RF) shield;
mounting a second integrated device die on the second side of the die attach pad; and
wire bonding the second integrated device die to the second side of the inner lead portions of at least some leads in the first set of leads to provide direct and physical electrical communication between the first integrated device die and the second integrated device die such that an electrical signal can pass between the first integrated device die and the second integrated device die by way of the at least some leads.

15. The method of claim 14, wherein mounting the first integrated device die comprises mounting a processor die, wherein mounting the second integrated device die comprises mounting a first inertial motion sensor die, the method further comprising:
stacking a second inertial motion sensor die on the processor die; and
wire bonding the second inertial motion sensor die to the processor die.

16. The method of claim 15, wherein mounting the first package lid on the first side of the leadframe comprises enclosing the processor die and the second inertial motion sensor die within the first cavity.

17. The method of claim 16, further comprising mounting a second package lid on the second side of the leadframe to form a second cavity and enclose the first inertial motion sensor die within the second cavity.

18. The method of claim 16, further comprising applying an encapsulant over the second side of the leadframe to encapsulate the first inertial motion sensor die.

19. The method of claim 14, wherein each lead of the first set of leads further include an outer lead portion, the method further comprising removing the outer lead portions of the leads in the first set of leads.

20. The method of claim 14, wherein providing the leadframe comprises providing a molded leadframe.

21. An integrated device package comprising:
a package substrate having a first side and a second side opposite the first side;
a first motion sensor die mounted on the first side of the package substrate;
a second motion sensor die mounted on the second side of the package substrate; and
a processor die mounted on the first side of the package substrate,
wherein the second motion sensor die and the processor die are in direct and physical electrical communication by way of a common lead such that an electrical signal can pass between the processor die and the second motion sensor die by way of the common lead.

22. The integrated device package of claim 21, wherein the first motion sensor die is a gyroscope die or an accelerometer die, and wherein the second motion sensor die is a gyroscope die or an accelerometer die.

23. The integrated device package of claim 21, wherein the package substrate comprises a leadframe, the leadframe comprising a die attach pad and a plurality of leads surrounding the die attach pad.

24. The integrated device package of claim 23, wherein the leadframe comprises a molded leadframe.

25. The integrated device package of claim 23, wherein the first motion sensor die is stacked on top of the processor die such that the processor die is disposed between the first motion sensor die and the package substrate.

26. The integrated device package of claim 21, further comprising a first package lid mounted on the first side of the package substrate to form a first cavity, the first motion sensor die mounted within the first cavity.

27. An integrated device package comprising:
- a package substrate having a first side and a second side opposite the first side;
- a first motion sensor die mounted on the first side of the package substrate;
- a second motion sensor die mounted on the second side of the package substrate;
- a first package lid mounted on the first side of the package substrate to form a first cavity, the first motion sensor die mounted within the first cavity; and
- a second package lid mounted on the second side of the package substrate to form a second cavity, the second motion sensor die mounted within the second cavity.

28. The integrated device package of claim 26, further comprising an encapsulant applied over the second side of the package substrate to encapsulate the second motion sensor die.

29. The integrated device package of claim 1, wherein the first integrated device die is wire bonded to the common lead and the second integrated device die is wire bonded to the common lead.

30. The integrated device package of claim 21, wherein the second motion sensor die is wire bonded to the common lead and the processor die is wire bonded to the common lead.

* * * * *